(12) United States Patent
Wu et al.

(10) Patent No.: US 9,118,335 B2
(45) Date of Patent: Aug. 25, 2015

(54) HIGH RESOLUTION MILLIMETER WAVE DIGITALLY CONTROLLED OSCILLATOR WITH RECONFIGURABLE DISTRIBUTED METAL CAPACITOR PASSIVE RESONATORS

(71) Applicant: Technische Universiteit Delft, Delft (NL)

(72) Inventors: Wanghua Wu, Delft (NL); John Robert Long, Delft (NL); Robert Bogdan Staszewski, Delft (NL)

(73) Assignee: Technische Universiteit Delft (NL)

(*) Notice: Subject to any disclaimer, the term of this patent is extended or adjusted under 35 U.S.C. 154(b) by 0 days.

(21) Appl. No.: 14/027,967

(22) Filed: Sep. 16, 2013

(65) Prior Publication Data

US 2014/0085012 A1    Mar. 27, 2014

Related U.S. Application Data

(60) Provisional application No. 61/701,690, filed on Sep. 16, 2012, provisional application No. 61/701,695, filed on Sep. 16, 2012, provisional application No. 61/704,522, filed on Sep. 23, 2012, provisional application No. 61/829,976, filed on May 31, 2013.

(51) Int. Cl.
*H03B 5/08* (2006.01)
*H03L 7/00* (2006.01)
(Continued)

(52) U.S. Cl.
CPC .. *H03L 7/00* (2013.01); *H03B 1/00* (2013.01); *H03B 5/124* (2013.01); *H03B 5/1215* (2013.01); *H03B 5/1228* (2013.01);
(Continued)

(58) Field of Classification Search
CPC .............. H03B 1/00; H03B 7/06; H03H 1/00; H03H 7/0153; H04B 1/10; H04B 1/26; H03L 7/00; H03L 7/099
USPC ........................ 331/167, 117 R, 117 FE, 36 C
See application file for complete search history.

(56) References Cited

U.S. PATENT DOCUMENTS 7,852,176 B2    12/2010  Chang
2008/0048760 A1*  2/2008  El Rai et al. ................... 327/524
(Continued)

OTHER PUBLICATIONS

Bogdan, R. et al., "All-Digital PLL and Transmitter for Mobile Phones", IEEE Journal of Solid-State Circuits, Dec. 2005, pp. 2469-2482, vol. 40, No. 12.
(Continued)

*Primary Examiner* — Arnold Kinkead
(74) *Attorney, Agent, or Firm* — Howard Zaretsky; Zaretsky Patent Group PC

(57) ABSTRACT

A novel and useful millimeter-wave digitally controlled oscillator (DCO) that achieve a tuning range greater than 10% and fine frequency resolution less than 1 MHz. Switched metal capacitors are distributed across a passive resonator for tuning the oscillation frequency. To obtain sub-MHz frequency resolution, tuning step attenuation techniques are used that exploit an inductor and a transformer. A 60-GHz fine-resolution inductor-based DCO (L-DCO) and a 60 GHz transformer-coupled DCO (T-DCO), both fabricated in 90 nm CMOS, are disclosed. The phase noise of both DCOs is lower than −90.5 dBc/Hz at 1 MHz offset across 56 to 62 GHz frequency range. The T-DCO achieves a fine frequency tuning step of 2.5 MHz, whereas the L-DCO tuning step is over one order of magnitude finer at 160 kHz.

23 Claims, 15 Drawing Sheets

(51) Int. Cl.
- H03B 7/06 (2006.01)
- H03B 1/00 (2006.01)
- H04B 1/10 (2006.01)
- H04B 1/26 (2006.01)
- H03B 5/12 (2006.01)
- H03L 7/099 (2006.01)

(52) U.S. Cl.
CPC .............. *H03B 5/1296* (2013.01); *H03B 7/06* (2013.01); *H03L 7/099* (2013.01); *H04B 1/10* (2013.01); *H04B 1/26* (2013.01)

(56) References Cited

U.S. PATENT DOCUMENTS

| | | | | |
|---|---|---|---|---|
| 2010/0134195 | A1* | 6/2010 | Lee et al. | 331/117 FE |
| 2012/0161890 | A1* | 6/2012 | Li et al. | 331/117 FE |
| 2013/0181783 | A1* | 7/2013 | Upadhyaya | 331/117 FE |
| 2013/0181793 | A1 | 7/2013 | Bauer | |

OTHER PUBLICATIONS

Heidari, M., "All-Digital Outphasing Modulator for a Software-Defined Transmitter", IEEE J. of Solid-State Circuits, Apr. 2009, pp. 1260-1271, vol. 44 No. 4.

Genesi, R. et al., "A 53 GHz DCO for mm-Wave WPAN", IEEE 2008 Custom Intergrated Circuits Conference (CICC), Jun. 2008, pp. 571-574.

LaRocca, I. et al., "CMOS Digital Controlled Oscillator with Embedded DiCAD Resonator for 58-64GHz Linear Frequency Tuning and Low Phase Noise", IEEE MTT-S 2009. pp. 581-585.

Staszewski, R. et al., "A First Multigigahertz Digitally Controlled Oscillator for Wireless Applications", IEEE Trans. Micro. Theory and Tech.,pp. 2154-2164, vol. 51, No. 11.

Long, J. et al., "Passive Circuit Technologies for mm-Wave Wireless Systems on Silicon", IEEE TCAS-I, Aug. 2012, pp. 1680-1693, vol. 59, No. 8.

Andreani, P. et al, "A Study of Phase Noise in Colpitts and LC-Tank CMOS Oscillators", IEEE J. of Solid-State Circuits, May 2005, pp. 1107-1118, vol. 40, No. 5.

Demirkan, M. et al., "Design of Wide Tuning-Hange CMOS VCOs Using Switched Coupled-Inductors", IEEE J. of Solid-State Circuits, May 2008, pp. 1156-1163, vol. 43, No. 5.

Yin, J. et al., "A 57.5-to-90.1GHz Magnetically-Tuned Multi-Mode CMOS VCO" IEEE 2012 Custom Intergrated Circuits Conference (CICC), Sep. 2012, pp. 1-4.

Wu, W. et al., "High-resolution 60-GHz DCOs with Reconfigurable Distributed Metal Capacitors in Passive Resonators", IEEE Radio Freq. Integ. Circ. Symp., Jun. 2012, pp. 91-94.

Reynolds, S. et al., "A Silicon 60-GHz Receiver and Transmitter Chipset for Broadband Communications", IEEE J. of Solid-State Circ., Dec. 2006, pp. 2820-2831, vol. 41, No. 12.

Okada, K. et al., "A 60-GHz 16QAM/8PSK/QPSK/BPSK Transceiver for IEEE802.15.3c", IEEE J. of Solid-State Circ., Dec. 2011, pp. 2988-3004 vol. 46, No. 12.

Abdul-Latif, M., et al., "A Wideband Millimeter-Wave Frequency Synthesis Architecture Using Multi-Order . . . ", IEEE J. Solid-State Circ., Jun. 2011, pp. 1265-1283, vol. 46, No. 6.

Lu, I. et al., "Wide Tunning Range 60 GHz VCO and 40 GHz DCO Using Single Variable Inductor", IEEE Trans. on Circ. and Sym., Feb. 2013, pp. 257-267, vol. 60, No. 2.

Long, J., "Monolithic Transformers for Silicon RF IC Design", IEEE J. of Solid-State Circ., Sep. 2000, pp. 1368-1382, vol. 35, No. 9.

Cheung, T.S.D. et al., "Differentially-Shielded Monolithic Inductors", Custom Integrated Circuits Conference, 2003. Proc. of the IEEE 2003, Sep. 2003, pp. 95-98.

LaRocca, T. et al.,"Millimeter-Wave CMOS Digital Controlled Artificial Dielectric Differential Mode Transmission Lines for . . . ", Micro. Symp. Dig., Jun. 2008, pp. 181-184.

Sjoland, H., "Improved Switched Tuning of Differential CMOS VCOs", IEEE Trans. on Circ. and Sys.-II: Analog and Digital Signal Proc., May 2002, pp. 352-355, vol. 49, No. 5.

Li, L. et al., "Design and Analysis of a 90 nm mm-Wave Oscillator Using Inductive-Division LC Tank", IEEE J. Solid-State Circ., Jul. 2009, pp. 1950-1958,vol. 44, No. 7.

Kim, D. et al., "A 70GHz Manufacturable Complementary LC-VCO with 6.14GHz Tuning Range in 65nm SOI CMOS", IEEE ISSCC, Feb. 2007, pp. 540-620.

Cao, C. et al., "Millimeter-Wave CMOS Voltage-Controlled Oscillators", IEEE Radio and Wireless Symposium, Jan. 2007, pp. 185-188.

* cited by examiner

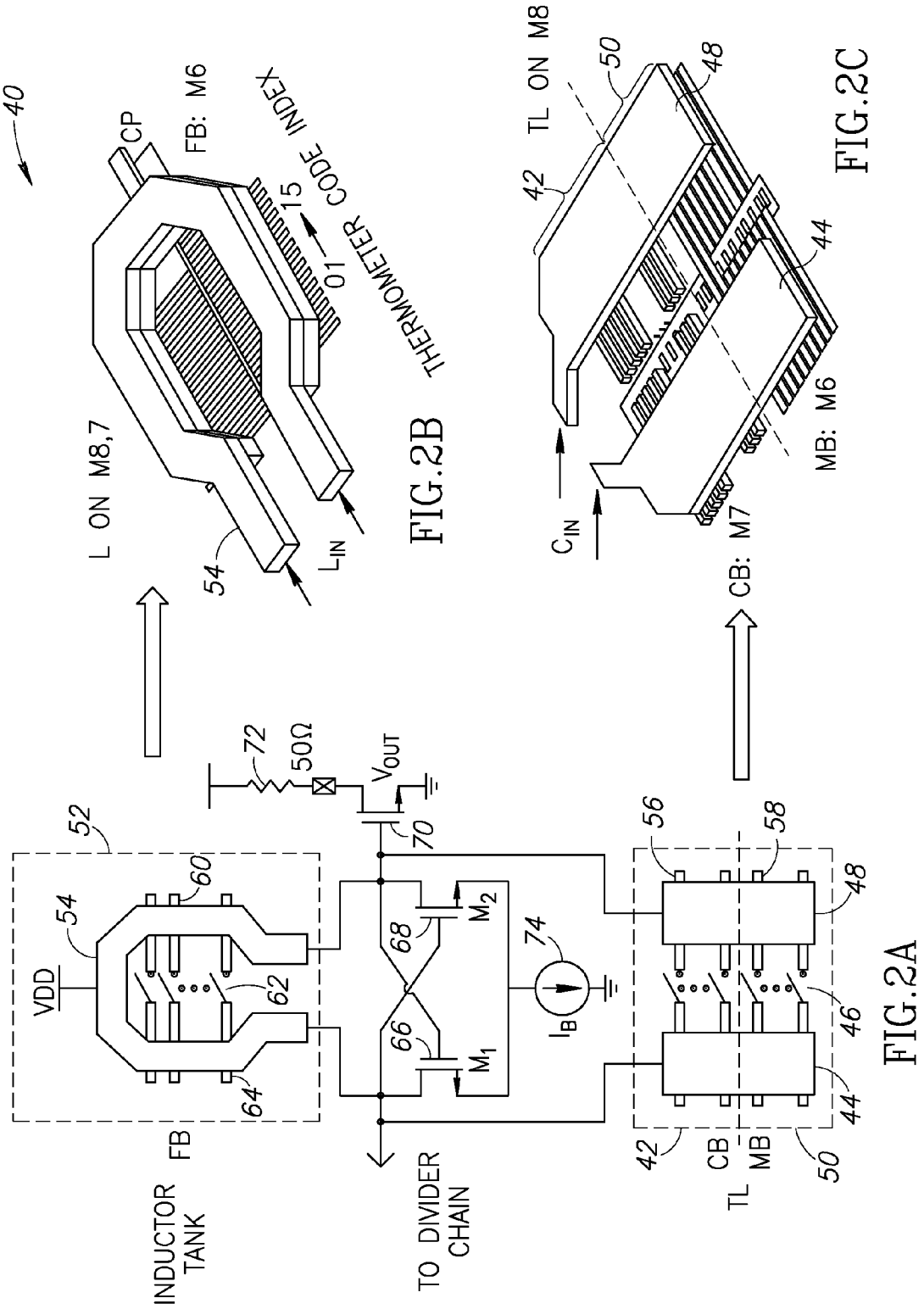

| FOR CB | $C_{ov}$ | 6.6fF |
|---|---|---|
| $R_b$ | 12kΩ | $C_{sb}$ | 1.46fF |
| $R_{on}$ | 55Ω | $C_p$ | 8.7fF |

HIGH RESOLUTION MILLIMETER WAVE DIGITALLY CONTROLLED OSCILLATOR WITH RECONFIGURABLE DISTRIBUTED METAL CAPACITOR PASSIVE RESONATORS

REFERENCE TO PRIORITY APPLICATIONS

This application claims priority to U.S. Provisional Application Ser. No. 61/701,690, filed Sep. 16, 2012, entitled "Digitally Intensive Transceiver," U.S. Provisional Application Ser. No. 61/701,695, filed Sep. 16, 2012, entitled "Class-F Oscillator," U.S. Provisional Application Ser. No. 61/704,522, filed Sep. 23, 2012, entitled "RF Transceiver," and U.S. Provisional Application Ser. No. 61/829,976, filed May 31, 2013, entitled "Time Domain RF Signal Processing," all of which are incorporated herein by reference in their entirety.

FIELD OF THE INVENTION

The present invention relates to the field of semiconductor integrated circuits and more particularly relates to a high resolution millimeter wave DCO incorporating reconfigurable distributed metal capacitor passive resonators.

BACKGROUND OF THE INVENTION

Frequency-modulated continuous-wave (FMCW) radar sensors operating in the millimeter-wave (mm-wave) region offer fine-resolution object detection and identification at short range. A linear frequency ramp with a minimum 6-GHz bandwidth is required to achieve a range resolution under 5 cm at 60 GHz. To synthesize an FMCW carrier an all-digital phase-locked loop (ADPLL) can be used which allows reconfigurability and permits a high degree of integration of the radio front-end with the digital baseband. MOS varactors are commonly used to tune DCOs in the low-GHz range. Their quality factor (Q), however, can be as low as ~5 for 50 fF at 60 GHz and the varactor capacitance ratio, $C_{max}/C_{min}$, of ~2 limits the DCO frequency tuning range. Moreover, a frequency tuning step lower than 1 MHz also cannot be achieved using varactor tuning.

All-digital phase-locked loops (ADPLLs) are currently used in numerous wireless applications in the low-gigahertz frequency range. Synthesizers at mm-wave frequencies, however, still rely upon analog-intensive PLL architectures due to the poor frequency resolution of conventional digital controlled oscillators (DCOs) tuned using switched MOS varactors. For an LC-tank resonating at 60-GHz band, typical tank inductance ($L_0$) and capacitance ($C_0$) values suitable for an oscillator implementation are 90 pH and 70 fF, respectively. An inductance smaller than ~90 pH will have a lower Q-factor when implemented as a top-metal loop in most CMOS technologies. Thus, a fine-tuning step of 1 MHz for a 60-GHz carrier requires a capacitance change ($\Delta C_0$) as small as 2 aF (i.e., $$f_0 = \frac{1}{2\pi\sqrt{L_0 C_0}},$$

assuming $$\frac{f_0}{C_0} \approx \frac{\Delta f_0}{\Delta C_0} = -\frac{f_0}{2C_0},$$

thus $$\Delta C_0 = \frac{1 \text{ MHz}}{60 \text{ GHz}} \cdot (2 \cdot 70 \text{ } fF) = 2.3 \text{ } aF),$$

which is ½5 the value of a minimum-sized NMOS varactor in 90-nm CMOS (i.e. 50 aF).

Furthermore, the Q-factor is as low as 5 for a 50-fF varactor at 60 GHz which severely affects the phase noise and jitter of a mm-wave DCO. Parasitic capacitance from interconnections contribute a significant fixed capacitance to the DCO tank which reduces the capacitive tuning ratio of the varactor ($C_{max}/C_{min}$) and results in a fractional tuning range smaller than 10% in practice. No prior art DCO operating above 50 GHz has been reported to date that has achieved 10% tuning range and sub-MHz tuning steps simultaneously.

There is thus a need for a millimeter wave digitally controlled oscillator (DCO) that exhibits wide tuning range (greater than 10%) while providing fine frequency resolution (less than 1 MHz).

SUMMARY OF THE INVENTION

A novel and useful millimeter-wave digitally controlled oscillator (DCO) that achieves a tuning range greater than 10% and fine frequency resolution less than 1 MHz. Switched metal capacitors are distributed across a passive resonator for tuning the oscillation frequency. To obtain sub-MHz frequency resolution, tuning step attenuation techniques are used that exploit an inductor and a transformer. A 60-GHz fine-resolution inductor-based DCO (L-DCO) and a 60 GHz transformer-coupled DCO (T-DCO), both fabricated in 90 nm CMOS, are disclosed. The phase noise of both DCOs is lower than −90.5 dBc/Hz at 1 MHz offset across 56 to 62 GHz frequency range. The T-DCO achieves a fine frequency tuning step of 2.5 MHz, whereas the L-DCO tuning step is over one order of magnitude finer at 160 kHz. The L-DCO and T-DCO consume 10 mA and 12 mA, respectively, from a 1.2-V supply. The size of each DCO core is 0.4×0.4 mm².

There is therefore provided in accordance with the invention, an oscillator circuit, comprising an active network operative to sustain an oscillation, a passive network coupled to said active network, and wherein said passive network comprises a tank circuit having a plurality of switched metal capacitors distributed across a passive resonator and controlled in accordance with a digital tuning control code.

There is also provided in accordance with the invention, an oscillator circuit, comprising an active network, and a digitally controlled passive resonator coupled to said active network, said passive resonator comprising a plurality of switched parallel metal strips operative to vary the capacitance of said passive resonator in accordance with a tuning control code.

There is further provided in accordance with the invention, a digitally controlled oscillator (DCO), comprising an active network, a digitally controlled passive resonator coupled to said active network, said passive resonator comprising a transformer having a primary winding coupled to said active network and a secondary winding having plurality of switched parallel metal strips operative to vary the impedance of said passive resonator in accordance with a tuning control code, and wherein said plurality of switched parallel metal strips includes one or more parallel metal strips for handling modulation and loop drift tracking functions.

BRIEF DESCRIPTION OF THE DRAWINGS

The invention is herein described, by way of example only, with reference to the accompanying drawings, wherein:

FIG. 2A is a diagram illustrating an example 60 GHz L-DCO;

FIG. 2B is a diagram illustrating example inductor based fine tuning;

FIG. 2C is a diagram illustrating example reconfigurable transmission line coarse and mid-coarse tuning;

DETAILED DESCRIPTION OF THE INVENTION

Figure 1:
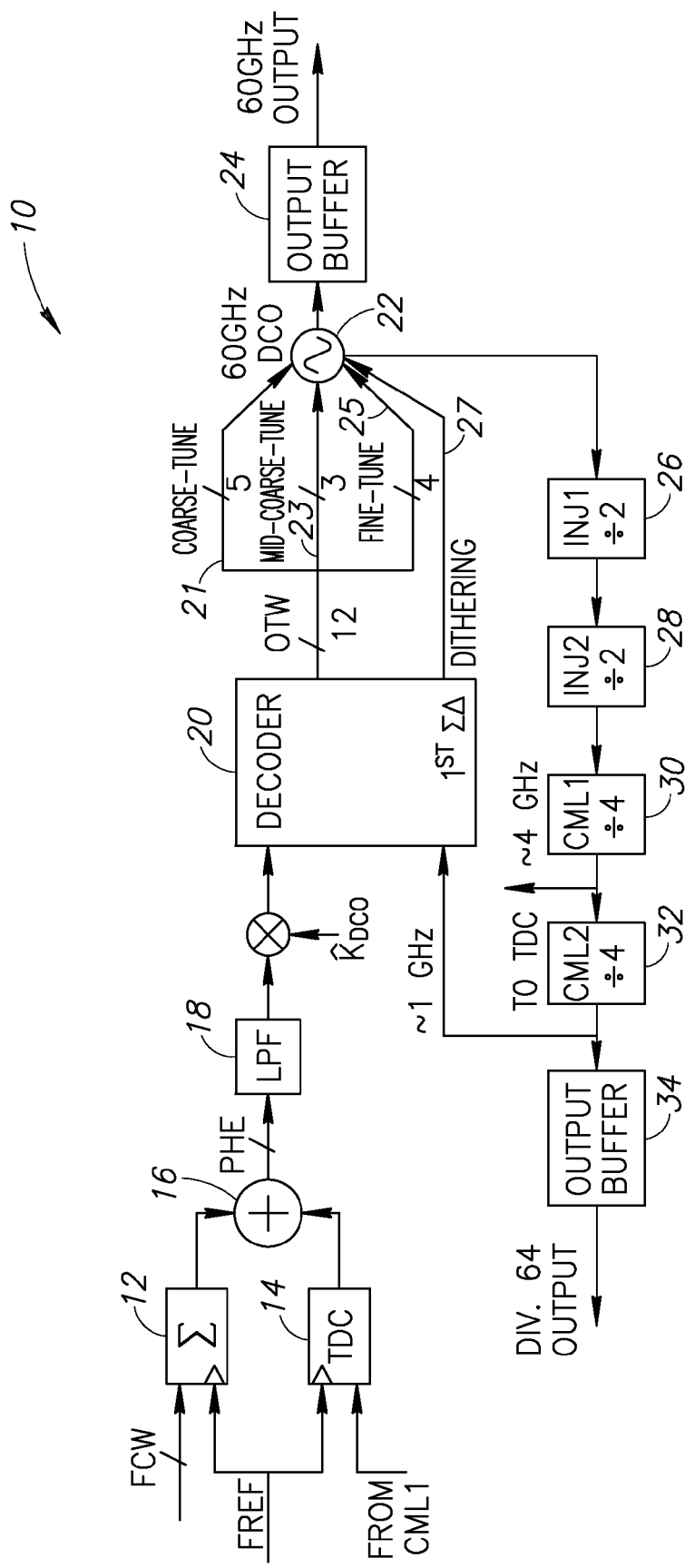
FIG. 1 is a high level block diagram illustrating an example 60 GHz ADPLL.

In an example DCO suitable for low-gigahertz oscillation, wide and precise linear frequency tuning is achieved through digital control of a large array of MOS capacitors that operate in the flat region of the C-V curve. The varactors are partitioned into binary-weighted and unit-weighted banks. The tank Q-factor is dominated by the on-chip inductor Q because the varactor banks typically have a Q-factor over 100 when operating below 10 GHz.

The Q-factor of the oscillator tank and its tuning range, however, are determined primarily by the capacitive tuning elements rather than the inductor at mm-wave frequencies. Considering a phase noise (PN) analysis in the $1/f^2$ regime, it is estimated that a tank Q-factor better than 10 is required in order to realize an LC oscillator with PN of −90 dBc/Hz at 1 MHz offset from a 60 GHz carrier (tank C=70 fF, differential oscillation swing $A_{Tank}$=2 V, N=2 for differential circuit, excess noise coefficient γ=2, at room temperature 300 K). A MOS varactor implemented in 90-nm CMOS technology must be less than 20 fF for a Q-factor better than 10 (simulated). The oscillator tuning range (TR) is limited to 6% in the 60-GHz band for such a small capacitance value ($C_{max}/C_{min}$=1.7 for the varactor, thus ΔC=20−20/1.7=8.2 fF, $$TR = \frac{f_{max} - f_{min}}{f_{min}}$$

$$= \frac{1/\sqrt{C_0} - 1/\sqrt{C_0 + \Delta C}}{1/\sqrt{C_0 + \Delta C}}$$

$$= \sqrt{1 + \frac{\Delta C}{C_0}} - 1$$

$$= 5.7\%).$$

Therefore, it is not possible to use simple varactor tuning with an LC tank and obtain wide tuning range and good PN simultaneously at mm-wave frequencies.

As an alternative to varactors, metal-oxide-metal (MoM) capacitors in series with an NMOS switch can be used in DCOs and voltage-controlled oscillators (VCOs) for coarse tuning Minimum sized switched MoM capacitors employed for oscillator fine tuning realize a frequency tuning step of 1.8 MHz for a 53-GHz DCO. The series parasitic capacitance of the MOS switch and the interconnections within the capacitor bank, however, are much higher than the minimum MoM capacitance, which affects the precision and matching of elements in the fine-tuning bank. Other tuning methods, such as inductive tuning using switched inductors and coupled resonators, provide only coarse tuning with a large step size (e.g., 1 GHz/bit) and must be augmented by switched capacitors to form a DCO. Thus, new circuit techniques such as those disclosed herein are required to realize a DCO operating at mm-wave frequency (e.g., 60 GHz) with sufficient tuning resolution.

In one embodiment, to achieve a 6-GHz linear DCO tuning range with sub-MHz frequency resolution at 60 GHz, passive resonators loaded by reconfigurable distributed metal capacitors are introduced. Metal strips placed beneath a resonator (i.e. transmission line, inductor and transformer) are configured by MOS switches to load the tank with more (or less) capacitance, thereby varying the DCO resonant frequency. The influence of these strips on the tank varies with position along the length of the resonator. Strips close to the virtual ground node of a differential resonator introduce significantly less capacitance (on the order of aF) than strips near the RF input terminals.

In one embodiment, a 60-GHz DCO (inductor-based, L-DCO) exhibits 160-kHz resolution utilizing the above technique. In another embodiment, the DCO (transformer-based, T-DCO) places the metal capacitor bank (i.e. strips) at the secondary coil, which loads the primary tank via magnetic coupling to achieve fine-tuning. This 60-GHz T-DCO achieves 2.5 MHz tuning step with less than 5% mismatch.

Coarse-tuning in both DCOs is achieved by digitally controlling a reconfigurable transmission line (TL) to achieve a 6-GHz linear tuning range. Both DCOs have measured phase noise (PN) better than −90.5 dBc/Hz at 1-MHz offset. Compared to prior art MOS varactor-based tuning, the DCO circuits of the present invention are less sensitive to process, voltage and temperature (PVT) variations, facilitating calibration of the DCO in an ADPLL.

The two DCO resonator embodiments described herein attain a fine frequency tuning step of 1 MHz at 60 GHz. In order to achieve a tuning range better than 10% with sub-MHz frequency resolution at mm-wave, passive resonators with distributed frequency tuning are utilized. Wider tuning range is possible when a digitally-controlled shield is employed, in which the metal shield strips (acting as switched MoM capacitors) are distributed along the differential resonator to minimize interconnection parasitics. The capacitance step, ΔC is varied by placing metal strips on different metal layers. The metal strips placed beneath the resonator (i.e. transmission line, inductor, or transformer) are configured by MOS switches to load the tank with more (or less) capacitance, thereby varying the DCO frequency.

A block diagram of an example millimeter wave ADPLL is shown in FIG. 1. At the core of the ADPLL, generally referenced 10, is a 60 GHz DCO 22 followed by a divide-by-64 analog prescaler (blocks 26, 28, 30, 32), which produces a digital output. Consequently, the combination of the DCO and its divide-by-64 prescaler features both a digital input and output, which allows the loop control circuitry to be implemented in a fully digital manner. The ADPLL operates in the digitally synchronous, fixed point phase domain as follows. The sampled variable phase obtained from a time-to-digital converter (TDC) 14 is subtracted (via adder block 16) from the reference phase to generate digitized phase error (PHE) samples, which are filtered by a loop filter (LF) 18 and converted to the oscillator tuning word (OTW) via decoder 20 and used to tune the oscillator to the desired frequency. This digitally-intensive approach is reconfigurable and enables complete integration of a radio front-end with the digital baseband.

The DCO core oscillates directly at 60 GHz and the raw OTW is partitioned into four data busses feeding four tuning banks: coarse-tuning (CB) bus 21, mid-coarse tuning (MB) bus 23, fine-tuning (FB) bus 25 and a high-speed FB dithering bank (bus 27) with time-averaged kilohertz-level resolution. These data busses are binary-to-thermometer decoded to digitally control the unit-weighted tuning elements in the tank thereby setting the DCO to the desired frequency. The 60-GHz DCO drives an output buffer and the divide-by-64 prescaler, which provides a 1-GHz signal for the TDC and digital part of an ADPLL.

Wide tuning range, small fine-tuning steps and low PN are the three major design metrics for the DCOs. The demands on spectral purity of the local oscillator in most mm-wave applications are modest compared to cellular mobile specifications, e.g., −85 to −90 dBc/Hz at 1-MHz offset for a 60-GHz receiver local oscillator using QPSK modulation. A fractional tuning range wider than 10% is desired for most mm-wave communication applications in order to cover the channel bands in the presence of process, voltage and temperature (PVT) variations. A 10% tuning range is achieved for the 60 GHz DCOs presented herein. The tuning range could be made wider by decreasing, or narrower by increasing the DCO tank inductance. A linear tuning characteristic is desired for frequency modulation purposes.

The finite frequency resolution of the 60 GHz DCO also contributes to the PN which should be kept much lower (e.g., 10 dB lower) than the natural PN of the DCO (e.g., −90 dBc/Hz at 1-MHz offset) to make it negligible. The additional PN introduced by raw frequency quantization (i.e. no ΣΔ dithering) of the DCO at an offset Δf is described by $$\mathcal{L}\{\Delta f\} = \frac{1}{12} \cdot \left(\frac{\Delta f_{res}}{\Delta f}\right)^2 \cdot \frac{1}{f_s} \cdot \text{sinc}\left(\frac{\Delta f}{f_s}\right)^2 \qquad (1)$$

where sampling rate $f_s$ equals the reference frequency, $f_{ref}$ and $\Delta f_{res}$ is the DCO resolution. Thus, the 60-GHz DCO should have a frequency resolution of ~100 kHz ($f_{ref}$=40 MHz) in order to realize −106 dBc/Hz phase noise at 1-MHz offset, which requires a tuning capacitor step (ΔC) of just 0.2 aF. ΣΔ dithering of the least significant bits (LSB) in the DCO tuning bank is employed to improve the frequency resolution further. For a 60-GHz DCO a raw resolution of 1 MHz with 4-bit ΣΔ dithering at a 1-GHz rate can reach the desired 100 kHz resolution. This corresponds to a frequency tuning word length of 12.6 bits for 10% tuning range. Increasing the ΣΔ modulation clock frequency above 1 GHz relaxes the requirement on the DCO raw resolution, but is not considered further because it would be difficult to implement in 90-nm CMOS.

A unit-weighted tuning bank would require $2^{13}$ unit elements. Capacitor mismatch is introduced when wiring the tuning capacitor banks together as the interconnect parasitics are comparable in size to the tuning elements themselves. Furthermore, it introduces nonlinearity into the tuning characteristic (i.e. step size) of the bank. Therefore, the tuning capacitors are partitioned into three banks (i.e. CB, MB and FB) in the two 60-GHz DCOs presented herein. The goal for the CB is to maximize the tuning range assuming a (worst-case) tank Q-factor of 10. The FB should achieve ultra-fine resolution in frequency with minimal interconnection parasitics and linear tuning steps.

To meet these goals a digitally-reconfigurable passive resonator with distributed metal capacitors for application in mm-wave DCOs is presented. The digitally reconfigurable resonator comprises a transmission line (TL), inductor or transformer and pairs of metal shield strips located beneath the resonator and distributed along its major dimension in various metal layers thereby exploiting the multiple metal layers available in nanoscale CMOS technologies. Each metal shield strip pair is connected to a MOS switch driven by a digital tuning signal.

Activating the switch alters the capacitive load on the resonator and introduces a distinct phase shift in the DCO loop that varies the oscillator frequency. The inductive part of the passive resonator is implemented in thick top metal to reduce the conductor losses and to minimize loss to the silicon substrate. The digital tuning banks are distributed along the length of the resonator. The tuning elements are connected via the signal path of the resonator on top metal without any additional interconnecting wires which eliminates complex wiring and optimizes the overall performance. The switched-metal capacitors which comprise the coarse-tuning and fine-tuning cells exhibit the same temperature coefficient, which simplifies the calibration procedure when used in an ADPLL. Electromagnetic (EM) simulation can be used for the entire resonator structure to capture the distributed LC effect, including all switched-metal capacitor pairs and the inductor/

TL/transformer as part of the DCO design procedure. The tank losses and DCO tuning characteristics can be captured accurately via EM simulations of the entire resonator physical layout (including the unwanted capacitive coupling between adjacent unit tuning cells) at mm-wave frequencies. The MOS switches are added in subsequent circuit simulations of the DCO to analyze the tuning linearity and the effect of switch losses.

A diagram illustrating an example 60 GHz L-DCO shown in FIG. 2A. A diagram illustrating example inductor based fine tuning shown in FIG. 2B. A diagram illustrating example reconfigurable transmission line coarse and mid-coarse tuning shown in FIG. 2C. The DCO, generally referenced 40, comprises an NMOS cross-coupled pair ($M_1$ 66, $M_2$ 68) which provides sufficient negative resistance to sustain the oscillation. The NMOS pair is coupled to a transmission line (e.g., coplanar stripline) 44, 48 with coarse 42 and mid-coarse tuning 50 portions and the inductor bank 52. One oscillator output of the NMOS pair drives a divide-by-64 chain, while the other drives a single-ended 50 Ohm output buffer 70 (or power amplifier).

Figure 4:
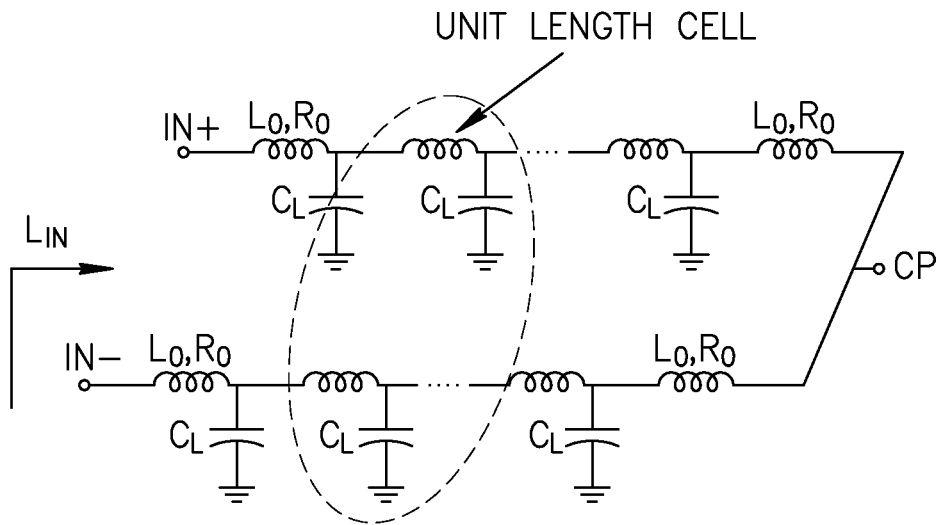
FIG. 4 is a diagram illustrating a lumped-circuit model of inductor based fine-tuning.
Figure 5:
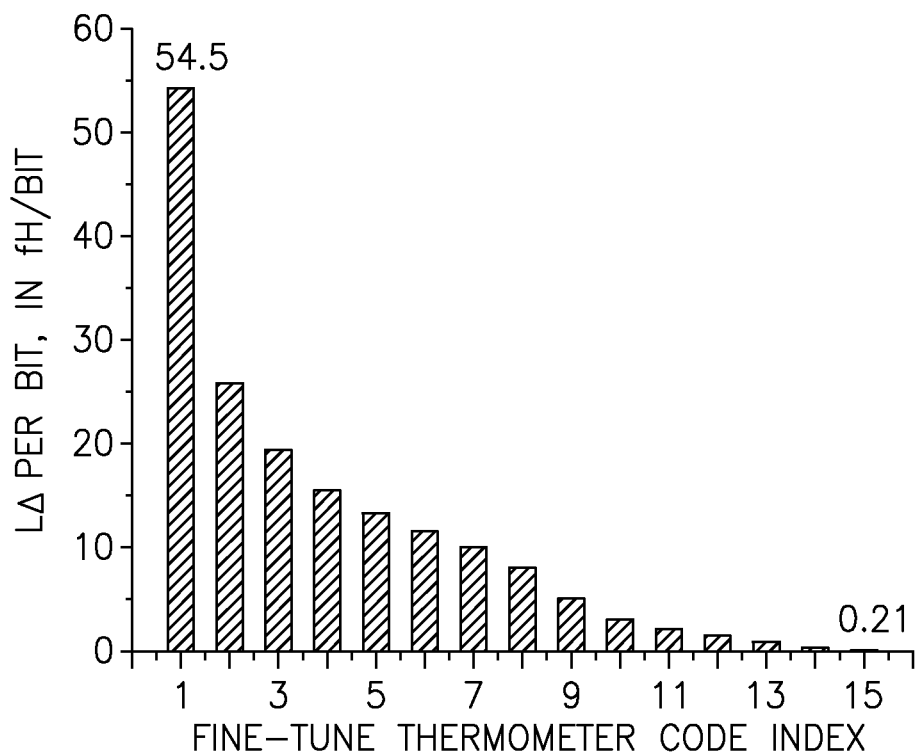
FIG. 5 is a diagram illustrating simulated ΔL/bit in the fine tuning bank.

Advanced CMOS process lithography allows the creation of a differential least significant bit (LSB) varactor on the order of tens of attofarads corresponding to a frequency resolution of ~10 MHz at 60 GHz. Moreover, parasitic capacitance of the interconnections within the varactor bank is comparable to or even higher than the minimum varactor capacitance at mm-wave frequencies degrading matching in the tuning bank. To achieve frequency resolution on the order of kHz while avoiding the use of components with minimum dimensions, an inductor-based capacitance reduction technique as illustrated in FIG. 4 is disclosed. A differential inductor of length l is divided into several units differentially loaded by $C_{load}=C_L/2$ in each sub-section. Although the $C_{load}$ array is unit-weighted, the impact of each $C_{load}$ on the equivalent input inductance ($L_{in}$) is different. Locating $C_{load}$ close to center-tap (CP) has less effect on $L_{in}$ compared to directly loading the inductor at its differential inputs. Equal width metal shield strips are placed beneath the inductor of the L-DCO (see FIG. 2B) on M6 (1 μm width and 1 μm spacing). Shorting a metal strip pair with an NMOS switch increases $C_{load}$ in the given sub-section. A thermometer code applied to the MOS switches from the differential inputs to CP gives the simulated $L_{in}$ change per bit (ΔL/bit) plotted in FIG. 5. The ΔL/bit is reduced progressively from 54.4 fH to 0.21 fH, corresponding to a Δf at 60 GHz of 23 MHz and 140 kHz, respectively. $L_{in}$ increases from 75.8861 to 76.0606 pH when the 15-bit thermometer code changes from all 0s to all 1s. Thus, high frequency resolution is achieved without exploiting minimum-sized capacitors or varactors for tuning. Moreover, a binary-weighted fine-tuning bank could be realized by carefully positioning the metal shield strips beneath the inductor with varied spacing.

Figure 3A:
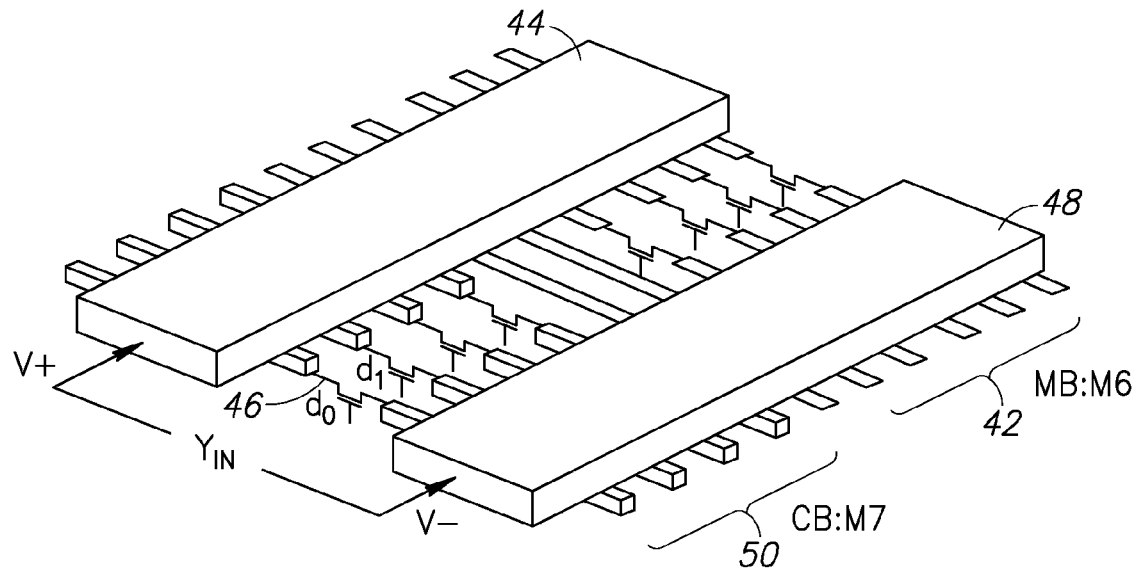
FIG. 3A is a 3D diagram illustrating the reconfigurable transmission line coarse and mid-coarse tuning in more detail.
Figure 3B:
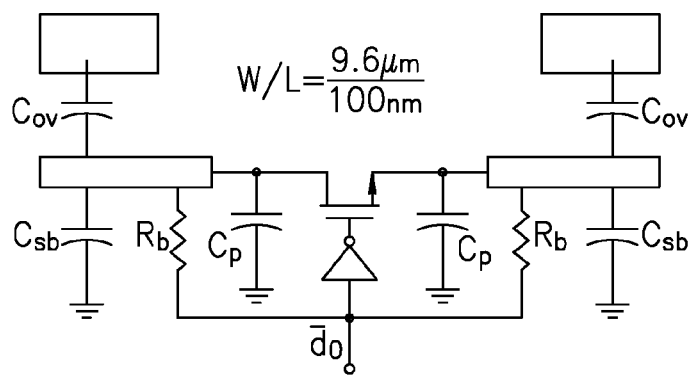
FIG. 3B is a diagram illustrating a detailed switch schematic including parasitics in the reconfigurable transmission line coarse tuning.

A 3D diagram illustrating the reconfigurable transmission line coarse and mid-coarse tuning in more detail is shown in FIG. 3A. A diagram illustrating the detailed switch schematic, including parasitics in the reconfigurable transmission line coarse tuning bank is shown in FIG. 3B.

A digitally-controlled reconfigurable transmission line (TL) is used for both coarse and mid-coarse tuning as shown in FIG. 3A. Shorting metal strips 42, 50 beneath the differential TL 44, 48 via NMOS switches 46 increases the capacitance per unit length thus reducing the wavelength ($\lambda=1/f\sqrt{LC}$) of the RF signal. This increases the phase shift along the TL and reduces the tank resonant frequency. The coarse tuning bank (CB) makes use of this slow-wave attribute to digitally control the phase shift on the TL by either opening or shorting the metal shield strips, thereby increasing or decreasing the frequency. Different metal layers beneath the TL are exploited to realize CB and mid-coarse tuning bank (MB) (i.e. M7 and M6 in FIG. 2C) in a compact structure. A 19-bit thermometer code CB and 8-bit MB are implemented as shown in FIG. 2C. The 60-GHz oscillation signal runs on the top TL of 34.5-μm width, 120-μm length and 39.6-μm spacing. Each bit in CB (i.e. M7 strips) can introduce a ΔC of 1 fF corresponding to 315 MHz at 60 GHz, whereas the MB located on the (lower) M6 achieves a ΔC of 0.13 fF/bit (~⅛ of the CB step-size). The capacitance ratio ($C_{max}/C_{min}$) of 1.6 provides over 6-GHz tuning range and a minimum Q-factor of 8. Floating dummy strips added between the CB and MB minimize magnetic coupling between banks.

The present invention provides two 60-GHz high-resolution DCOs employing digitally-reconfigurable passive resonators. The first DCO, the L-DCO, is designed around an inductor-based fine-tuning bank, whereas the T-DCO employs a weakly-coupled transformer to implement a unit-weighted fine-tuning bank. Both DCOs comprise 3-stage segmented tuning: a CB, an FB and a MB that bridges the gap in step-size between CB and FB. Thermometer encoding is employed to ensure monotonicity.

The DCO of the present invention generates fine-tuning steps without employing minimum-sized structures so that the interconnection parasitics do not limit the frequency step size and uniformity. The two techniques incorporate the fine tuning into either an inductor or transformer. The fine-tuning bank (FB) is isolated from the TL-based CB in the physical layout to minimize capacitive inter-bank coupling. Compared to an inductor or transformer without the digital tuning scheme the degradation in its Q-factor due to fine-tuning is negligible (e.g., <0.5 in total Q), since the embedded ΔC for each tuning bit is only ~2 aF (Δf=1 MHz). Therefore, even when a small MOS switch is employed (e.g., W/L=1/0.1 μm, on-resistance $R_{on}$=400Ω), the Q-factor of the series RC product for the switch is still above 3.3 k in the 60-GHz band $$\left(n.b., Q = \frac{1}{2\pi f \cdot \Delta C \cdot R_{on}}\right).$$

Figure 6A:
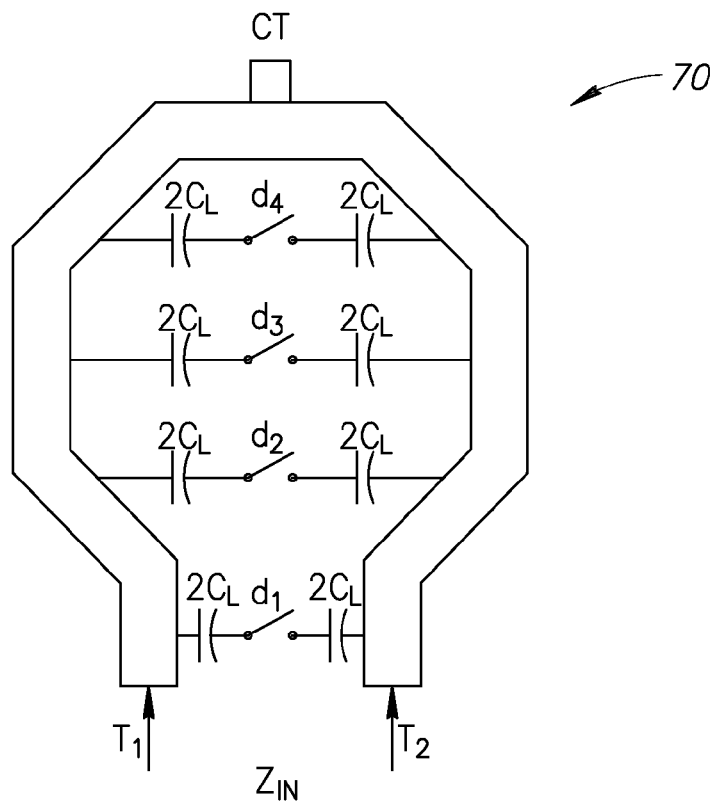
FIG. 6A is a diagram illustrating an example implementation of a distributed LC fine-tuning bank.

The inductor-based fine tuning bank (FB) is illustrated conceptually in FIG. 6A. An inductor is loaded differentially by a number of capacitors ($C_L$) along its entire length from the differential inputs to the center tap (CT). When the switch in series with $C_L$ is ON, the inductor sees an increased capacitive load which increases the differential input impedance ($Z_{in}$) of the tank as it approaches parallel resonance. Although the $C_L$ array is unit-weighted, the sensitivity of $Z_{in}$ to changes in $C_L$ (i.e. $\partial Z_{in}/\partial C_L$) depends upon the position of the switched capacitor in the array. Placing $C_L$ close to the center-tap introduces less phase shift compared to directly loading the inductor at the differential terminals connected to the oscillator core.

Figure 6B:
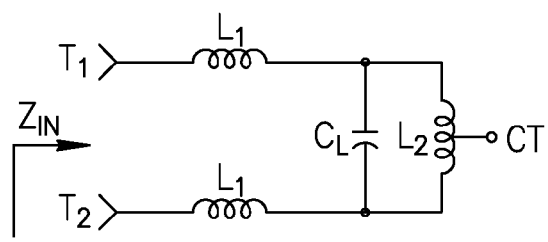
FIG. 6B is an example circuit model illustrating the principle of timing sensitivity attenuation.

The reduced tuning sensitivity seen along the inductor length can be explained using the simplified circuit model shown in FIG. 6B. The total loop inductance ($L_T$) between differential input terminals $T_1$ and $T_2$ is divided into three sections so that $L_T$ consists of three parts (i.e. $L_T=2L_1+L_2$). The mutual couplings between two $L_1$ segments and between $L_1$ and $L_2$ are negligible ($k_m$<0.1). The impedance $Z_{in}$ seen across the terminals differentially when a single capacitor ($C_L$) is placed in parallel with $L_2$ is given by $$Z_{in} = j\omega 2L_1 + \frac{1}{j\omega C_L} \| j\omega L_2 = j\omega L_1 \left[ 2 + \frac{(L_2/L_1)}{1 - \omega^2 L_2 C_L} \right] \quad (2)$$

Note that when $L_2$ approaches zero, $$\frac{\partial z_{in}}{\partial C_L} = j\omega \left[ \frac{(\omega L_2)^2}{1 - \omega^2 L_2 C_L} \right] = \begin{cases} 0, & L_2 \to 0 \\ j\omega \frac{(\omega L_T)^2}{1 - \omega^2 L_T C_L}, & L_2 \to L_T, \end{cases} \quad (3)$$

$\partial Z_{in}/\partial C_L$ also approaches zero. Moreover, the inductor input impedance is desensitized to changes in capacitor $C_L$ when it is placed close to the center-tap. On the other hand, when $L_1$ is zero and $L_2$ is maximum (i.e. $L_2=L_T$), $\partial Z_{in}/\partial C_L$ reaches its highest value possible.

To quantify the change in tuning sensitivity that is achieved by this method, we normalize $\partial Z_{in}/\partial C_L$ for an arbitrary $L_2$ to its maximum value (i.e. $\partial Z_{in}/\partial C_L$ at $L_2=L_T$) and name this factor the normalized tuning sensitivity $\alpha$, $$\alpha = \frac{\partial Z_{in}}{\partial C_L} \Big/ \frac{\partial Z_{in}}{\partial C_L}\bigg|_{L_2=L_T} \quad (4)$$
$$= \frac{n^2(1 - \omega^2 L_T C_L)}{1 - \omega^2 n L_T C_L} \xrightarrow{\omega^2 L_T C_L \ll 1} n^2 (n \le 1),$$

where $n=L_2/L_T$. As seen from (4), $\alpha$ is proportional to the square of n. Thus, the change in the terminal impedance when capacitor $C_L$ is added diminishes quickly if it is placed close to the inductor center-tap, rather than across the inductor input terminals (as in a conventional DCO).

Consider the implementation shown in FIG. 6A. Four switched-capacitor unit cells are equally distributed along the inductor length and the minimum normalized tuning sensitivity in this case is $\alpha=\frac{1}{16}$ (n=¼). The value of $\alpha$ for each bit in the tunable inductor of FIG. 6A is 1, 9/16, ¼ and 1/16, respectively (in sequence towards the center-tap CT). Thus, a fine-tuning bank with a tuning sensitivity that reduces gradually is formed. It is not necessary to distribute the tuning capacitors evenly along the inductor. A binary weighted fine-tuning bank could also be obtained by sizing n as 1, 1/√2, ½, 1/√8, ¼ in sequence, according to (4). When used in an ADPLL, nonlinearity in the tuning steps (i.e. $K_{DCO}$) could be compensated by adjusting the DCO gain normalization block (1/$R_{DCO}$, as shown in FIG. 1) so that the PLL closed-loop bandwidth does not change.

To attenuate the tuning step further, more tuning cells can be placed closer to the inductor center-tap. For example, 16 equally distributed unit cells result in an $\alpha$ of 1/256 for the cell located closest to the center tap. In practice, the maximum number of tuning cells that can be added is limited by the physical sizes of the inductor and the MOS transistor used to switch the loading capacitance. For the 60 GHz LC tank where the outer dimension of the inductor is 80 µm×60 µm, approximately 20 tuning capacitors can be added.

The above analysis neglects the loss in the switched-capacitor unit cell for simplicity. This is a fair assumption for the switched-capacitor structure used for fine tuning. The $\Delta C$ is on the order of 0.1 fF and even with the on-resistance of the MOS switch at 200Ω, the Q-factor of this series RC network is still 132 at 60 GHz. Implementation of the inductor-based FB for a 60-GHz DCO is described infra. Metal shielding strips connected to MOS switches are placed beneath the inductor and are digitally controlled to act as the switched $C_L$ shown in FIG. 6A.

Although the L-DCO achieves a fine frequency resolution of ~100 kHz/bit, a linear tuning characteristic in FB is desired for FMCW synthesis since a simple binary-to-thermometer decoder is used. Therefore, an additional capacitance reduction technique based on a transformer resonator with linear tunability is described. The schematic of the proposed T-DCO is shown in FIG. 8A. It uses the same CB 144 and MB 116 as the L-DCO and drives an identical divider chain. As shown in FIG. 8A, the primary coil ($L_p$) of the transformer tank 118 is connected to the MOS cross-coupled pair while the secondary coil ($L_s$) is connected to a variable capacitor load ($C_v$). Varying $C_v$ changes $L_{in}$ as seen from the primary coil inputs. Compared to directly loading the primary coil inputs by $C_v$, the capacitive loading effect on $L_{in}$ is reduced by a factor proportional to $k_m^2$. When the transformer windings are weakly coupled (e.g., $k_m$=0.3), a capacitance reduction factor larger than 10 can be achieved. Moreover, a linear FB can be formed by replacing $C_v$ in FIG. 8A by a unit-weighted capacitor array.

Figure 8B:
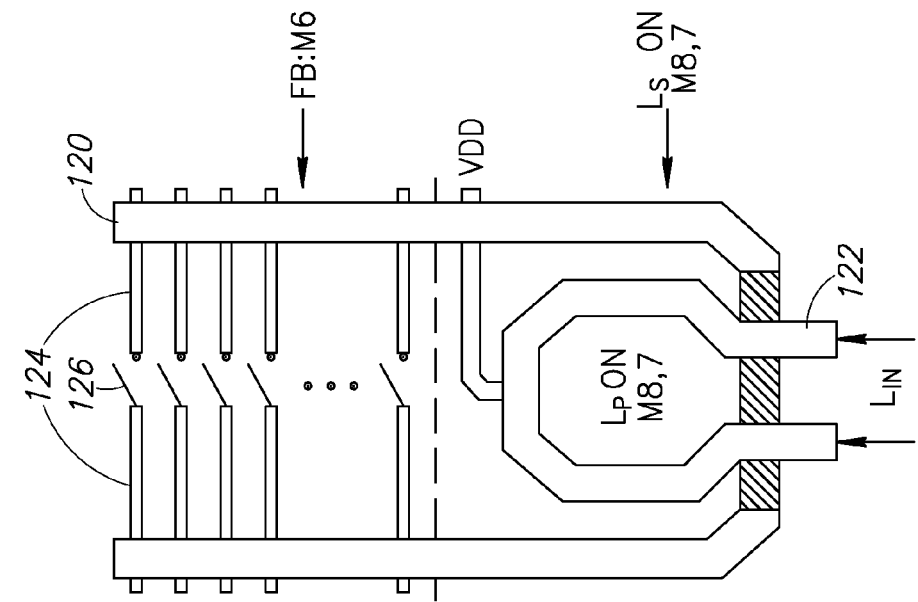
FIG. 8B is a diagram illustrating a top layout view of the T-DCO fine-tuning bank.
Figure 8A:
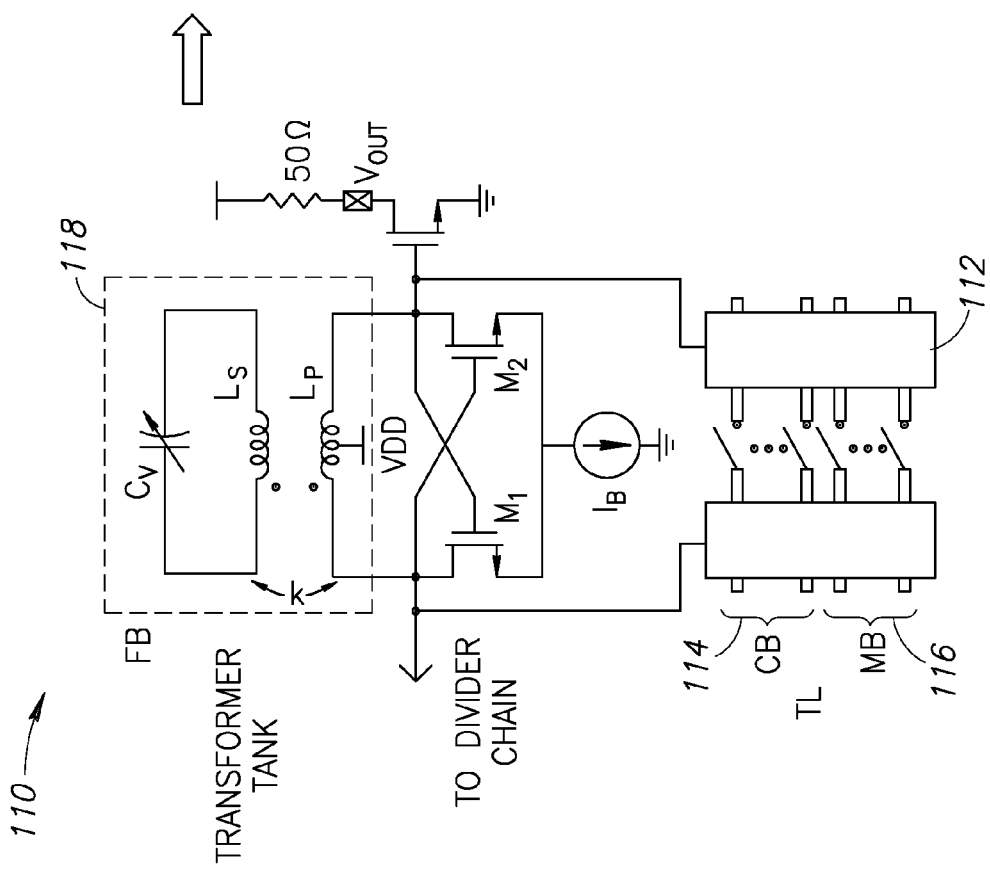
FIG. 8A is a schematic diagram illustrating an example 60 GHz T-DCO.

The detailed implementation of the transformer-based FB is shown in FIG. 8B. Another digitally-controlled differential TL loads the secondary coil of the transformer. Shorting each strip pair introduces a $\Delta C$ of 50 aF. The primary and the secondary inductances of the transformer are 72.3 pH and 58.9 pH each and the coupling factor $k_m$ is 0.275. The equivalent inductance change seen from the primary coil is 6 fH/bit, corresponding to ~2.5 MHz at 60 GHz. In one example embodiment, an 18-bit thermometer code FB is implemented. Higher frequency resolution can be obtained by resizing the shielding strips on lower metal layers. The unwanted coupling between adjacent metal strips adds nonlinearity to the tuning curve. It is accounted for by optimizing the width of the metal strips and the gap between adjacent metal strips with the aid of a simulator such as the EMX electromagnetic (EM) simulator. The simulated Q-factor of the transformer-based FB is 16.5 in the 60-GHz band.

Figure 7A:
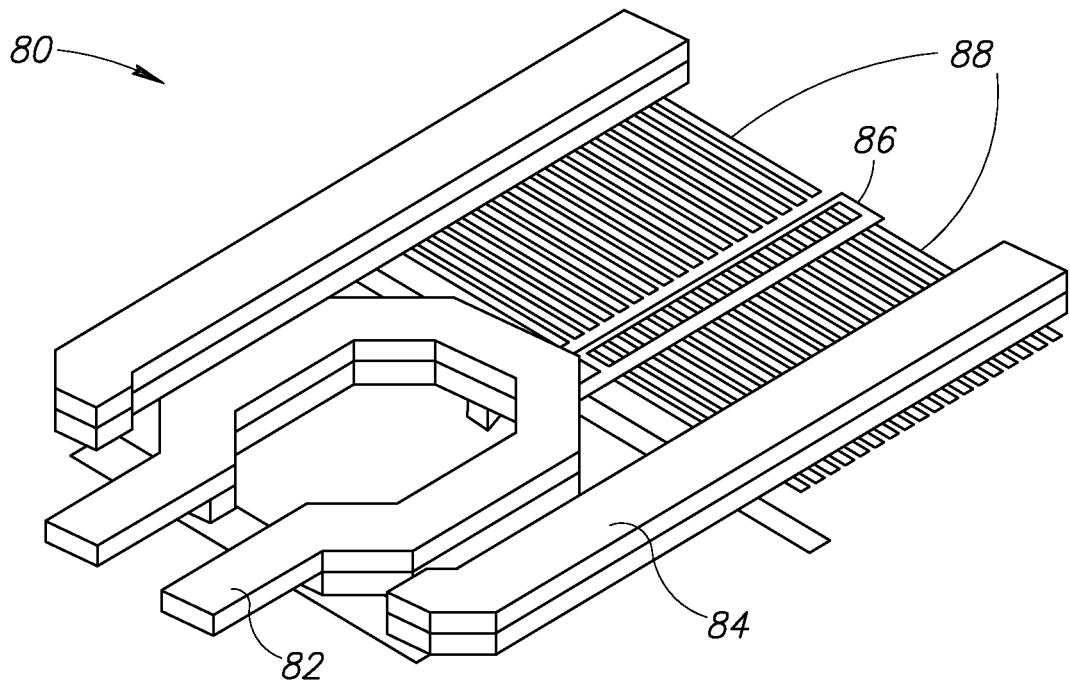
FIG. 7A is a diagram illustrating the transformer coupled fine-tuning technique of the present invention.
Figure 7B:
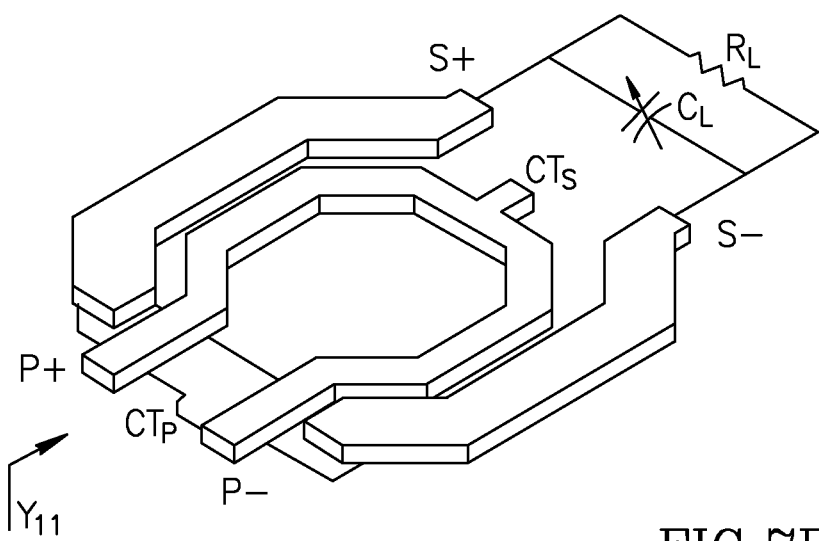
FIG. 7B is a diagram illustrating the transformer coupled fine-tuning technique of the present invention.

It is noted that a unit-weighted fine-tuning bank is desired for applications such as an FM transmitter for communication applications or frequency ramp generation in an FMCW radar application. The tunable resonator 80 consists of a transformer and a tunable load capacitor ($C_L$) connected to its secondary coil 84 as shown in FIGS. 7A and 7B. Resistor $R_L$ models the losses of $C_L$. The primary coil 82 of the transformer is connected directly to the oscillator core and a coarse switched-capacitor bank. The tunable transformer is analyzed as a one-port network for the admittance seen at the primary terminals ($Y_{11}$). The real part of $Y_{11}$ (i.e. conductance Goran) models the transformer losses. The imaginary part (i.e. inductive susceptance $B_{tran}$) in combination with capacitive susceptance $B_1$ connected at the primary determines the oscillation frequency, $f_{osc}$, (such that $B_{tran}+B_1=0$). The coupling factor between the primary ($L_p$) and secondary ($L_s$) coils is $k_m$. When either $C_L$ or $R_L$ change, the change in admittance is reflected back to the primary coil and varies $B_{tran}$, thereby altering the oscillation frequency. The susceptance seen across the primary terminals (i.e. $L_{eq}=1/(j\omega B_{tran})$) can be varied in ultra-fine steps even when the discrete tuning steps in $C_L$ are moderate.

Figure 7C:
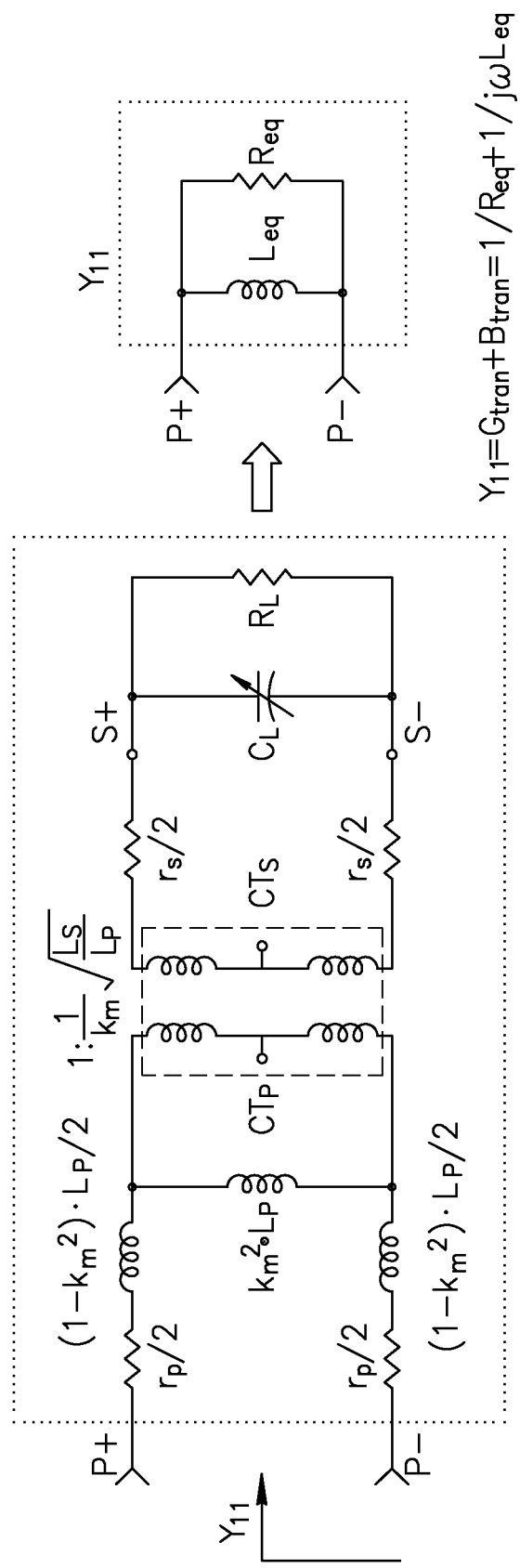
FIG. 7C is a diagram illustrating the lumped-circuit model for the structure of FIG. 7B.

Preferably, numerical analysis is used to determine $Y_{11}$ and $L_{eq}$ accurately since parasitic capacitances are difficult to estimate precisely at high frequencies and are best investigated from simulation of a particular case. Some qualitative observations about the behavior of the tunable transformer, however, can be made from the simplified lumped-element circuit model shown in FIG. 7C.

The parasitics to the substrate are neglected when analyzing the impedance transformation from the secondary to the primary coil. The conductor losses $r_s$ and $r_p$ have a negligible effect on $B_{tran}$ and are also ignored in the following analysis. Assuming that $C_L$ is lossless (i.e. $R_L$ very large), the equivalent inductance determined from $\text{Im}[Y_{11}]$ is given by (5) below.

$$L_{eq}|_{R_L=\infty} = L_p\left(1 + k_m^2 \frac{\omega^2 L_s C_L}{1 - \omega^2 L_s C_L}\right) \xrightarrow{\omega^2 L_s C_L \ll 1} L_p(1 + k_m^2 \omega^2 L_s C_L) \quad (5)$$

For comparison, the terminal inductance $L_{eq}$ seen when $C_L$ is connected directly to the primary coil is given by (6).

When $C_L$ is connected to $L_p$:

$$L_{eq}|_{R_L=\infty} = \frac{L_p}{1 - \omega^2 L_p C_L} \xrightarrow{\omega^2 L_p C_L \ll 1} L_p(1 + \omega^2 L_p C_L) \quad (6)$$

Placing capacitor $C_L$ at the secondary coil results in the same $L_{eq}$ as when a capacitor of value equal to $C_L \cdot (k_m^2 L_s/L_p)$ is connected to the primary turn. In other words, the tuning sensitivity is attenuated by a factor of $k_m^2 L_s/L_p$, which can be much smaller than unity for a weakly coupled transformer (e.g., 0.01 for $k_m$=0.1). Therefore, fine-tuning of $L_{eq}$ is possible using a capacitor bank with a moderate tuning step size. Furthermore, $L_{eq}$ increases linearly with increasing $C_L$ when the self-resonant frequency of the secondary coil ($1/\sqrt{L_sC_L}$) is much higher than the desired operating frequency, $\omega$ (i.e. $\omega^2 L_s C_L \ll 1$). Thus, a FB with a uniform tuning step can be achieved using a unit-weighted capacitor bank for $C_L$.

In order to obtain a linear frequency tuning characteristic, it was shown that the capacitor $C_L$ should satisfy the condition $\omega^2 L_s C_L \ll 1$. The capacitance attenuation factor can be increased by either reducing the ratio of secondary to primary inductance ($L_s/L_p$), or by reducing the coupling coefficient $k_m$. However, $k_m$ cannot be made lower than 0.1 because the transformer bandwidth also depends upon $k_m$ and it should be wide enough to cover the entire tuning range of the oscillator (e.g., 10% of 60 GHz for the DCOs presented herein).

Figures 9A, 9B:
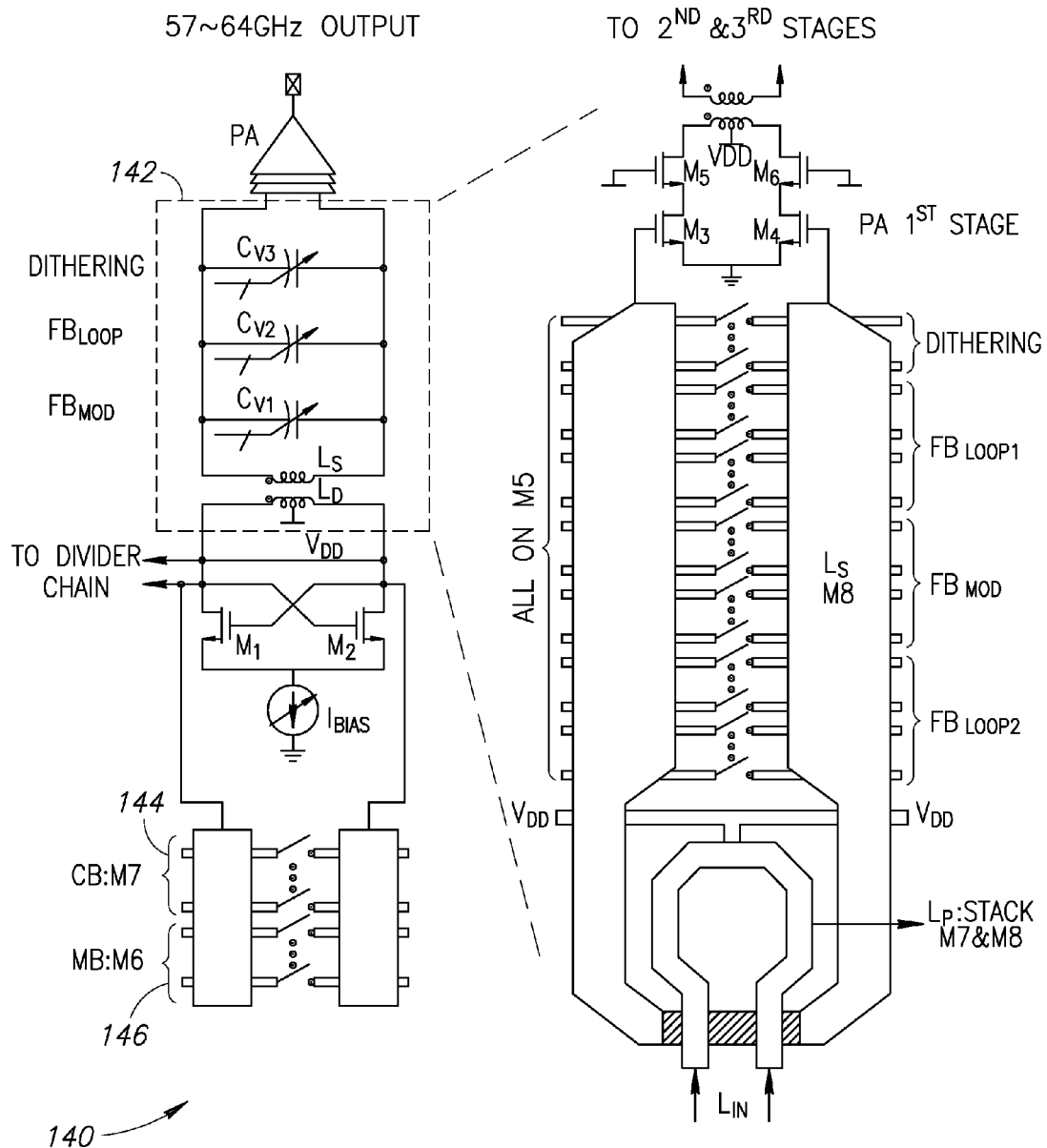
FIG. 9A is a diagram illustrating an example transformer coupled fine tuning technique in more detail.
FIG. 9B is a diagram illustrating the different tuning sub-banks of the fine tuning technique of the present invention.

A diagram illustrating an example transformer coupled fine tuning technique in more detail shown in FIG. 9A. A diagram illustrating the different tuning sub-banks of the fine tuning technique of the present invention shown in FIG. 9B. The DCO oscillator circuit, generally referenced 140, comprises $M_1$, $M_2$ transistor pair coupled to CB 144, MB 146 and transformer tank 142. The metal strips under the secondary transformer winding are divided into several groups and fabricated on M5 metal layer. The top group is used for dithering, followed by a first loop $FB_{Loop1}$ for tracking drift, $FB_{MOD}$ for modulation and a second loop $FB_{Loop2}$ for tracking drift.

Figure 10:
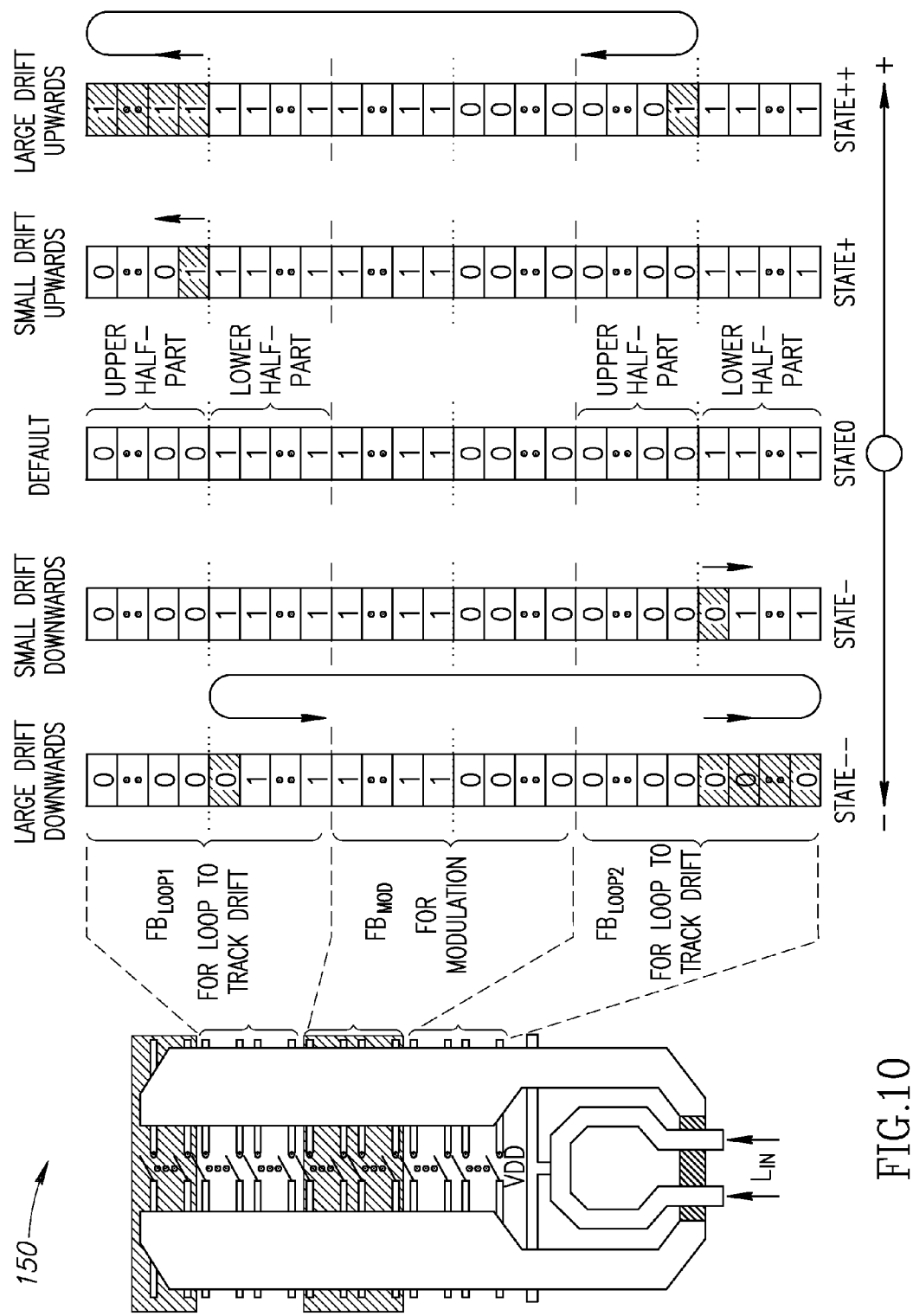
FIG. 10 is a diagram illustrating the DCO fine-tuning bank configuration.

A diagram illustrating the DCO fine-tuning bank configuration shown in FIG. 10. Adjustments to the frequency are made by turning a respective MOS switch on or off. The default State 0 is shown in the center where $FB_{Loop1}$ and $FB_{Loop2}$ are divided into a lower half portion and an upper half portion. In the default State 0, both upper half portions are '0' and both lower half portions are '1'. Small drifts downward in frequency are corrected in State− by turning one or more switches off. Larger drifts downward are corrected in State−− by turning additional switches off. Note the order in which the switches are turned off where the action begins in the lower half portion of $FB_{Loop2}$ and loops to the lower half portion of $FB_{Loop1}$.

Similarly, small drifts upward in frequency are corrected in State+ by turning one or more switches on. Larger drifts upward are corrected in State++ by turning additional switches on. Note the order in which the switches are turned on where the action begins in the upper half portion of $FB_{Loop1}$ and loops to the upper half portion of $FB_{Loop2}$.

The L-DCO discussed supra has a measured tuning range from 56.15 to 62.158 GHz. The measured and simulated CB curves are plotted in FIG. 11. The CB of the L-DCO realizes linear tuning at 312 MHz/bit with less than 12% variation. The linear tuning of MB at each CB code is plotted in FIG. 12. More than 8% overlap between the adjacent frequency tuning curves in FIG. 12 guarantees continuous tuning across the entire range. To accommodate PVT variations, the overlap ratio should be increased to 30% according to simulations. This can be achieved by adding more MB strips into the TL structure.

Figure 13A:
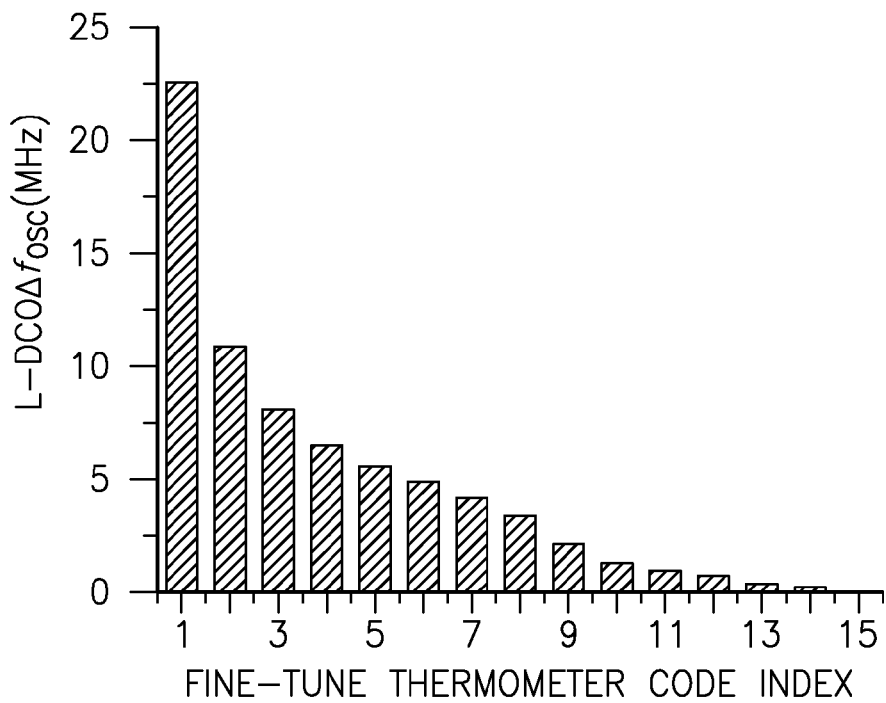
FIG. 13A is a graph illustrating the L-DCO fine tuning characteristic.

The measured L-DCO fine-tuning step for each bit in the FB (when CB=8 and MB=0) is shown in FIG. 13A. A progressive reduction in step size from 22.5 MHz for the first bit (i.e. MSB) in the FB (i.e. farthest from the CT point), to 160 kHz for the last bit (i.e. LSB) is observed. The worst-case tuning range of FB is 52.3 MHz (obtained at maximum CB and MB codes), which is over 30% larger than the tuning step size in the MB.

Figure 14:
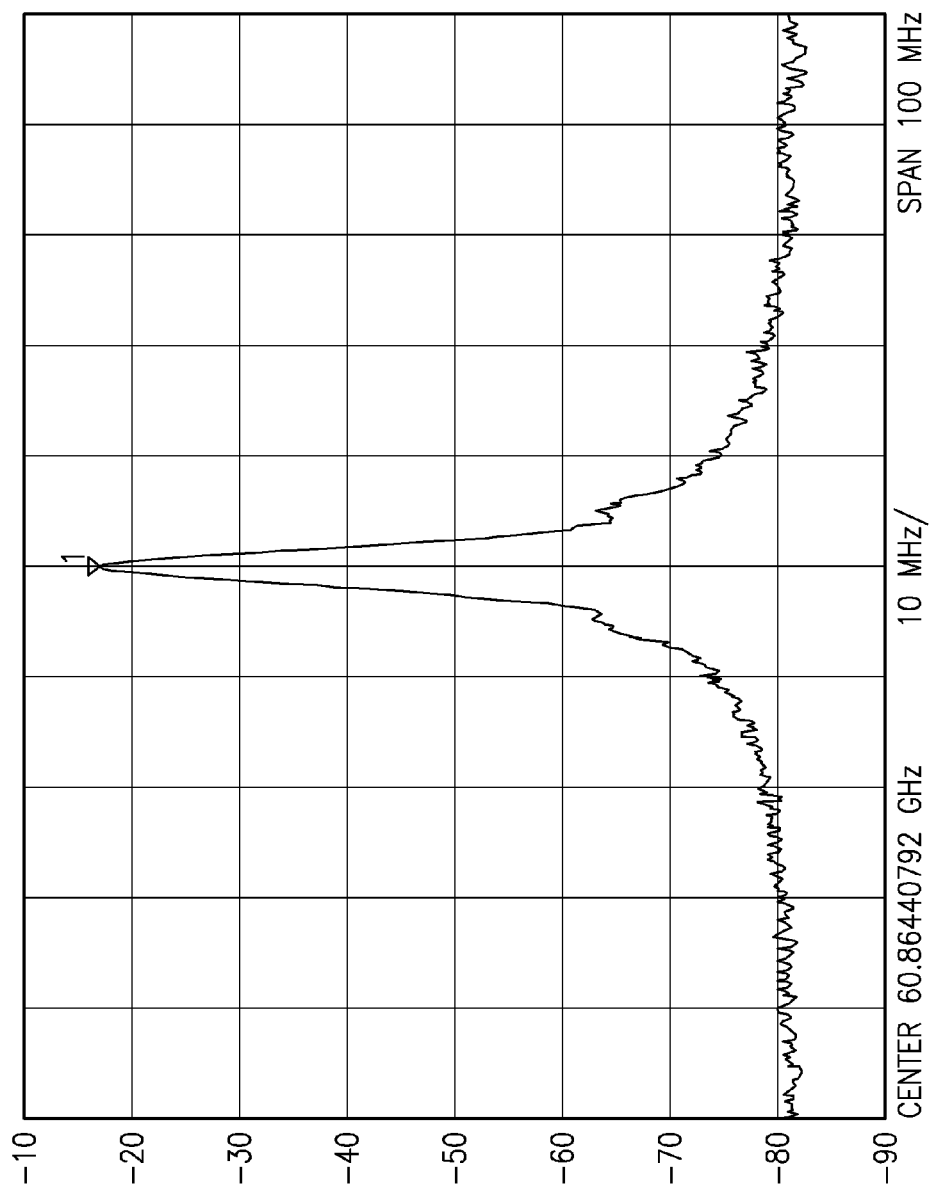
FIG. 14 is a graph illustrating the 60 GHz ADPLL output spectrum when locked to 60.02 GHz.

A graph illustrating the 60 GHz ADPLL output spectrum when locked to 60.02 GHz shown in FIG. 14. After subtracting the loss of the cables and probes at 60.864 GHz (−13.5-dB loss), the measured output power is −3.4 dBm. The PN measured at the divide-by-64 output from a 951-MHz carrier is −127.83 dBc/Hz at 1 MHz offset. The noise floor in is limited by the on-chip output buffer in the example embodiment herein. A separate measurement of the L-DCO output PN at 60.86 GHz (−92.5 dBc/Hz at 1-MHz offset) agrees well with the degradation expected after the division by 64 (theoretically $20 \log_{10} 64$=36.1 dB). The measured L-DCO PN across the entire tuning range is better than −90.5 dBc/Hz at 1 MHz offset which is just 1 dB poorer than predicted from simulations.

Figure 11:
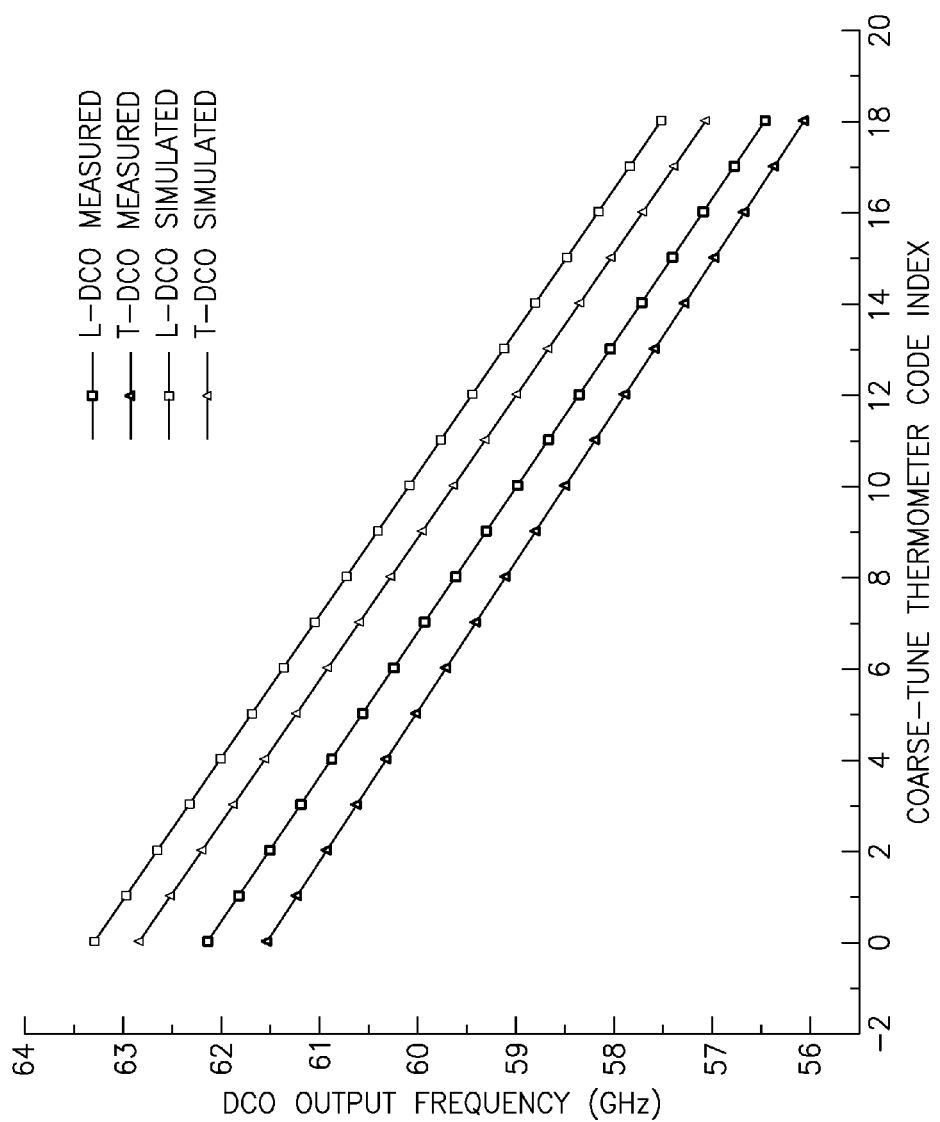
FIG. 11 is a graph illustrating the coarse-tuning characteristic of the L-DCO and T-DCO.
Figure 12:
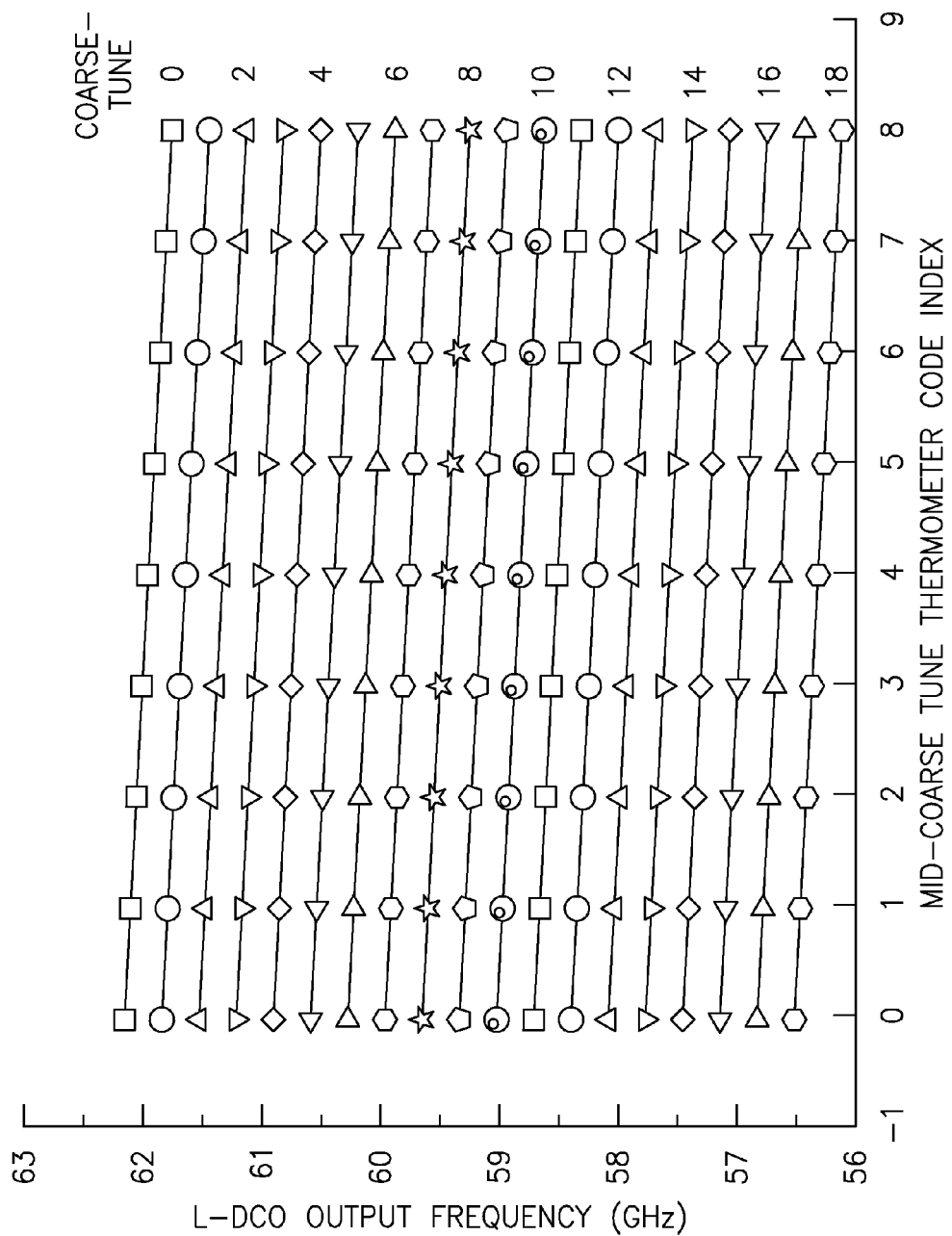
FIG. 12 is a graph illustrating the mid-coarse tuning characteristic of the L-DCO.
Figure 13B:
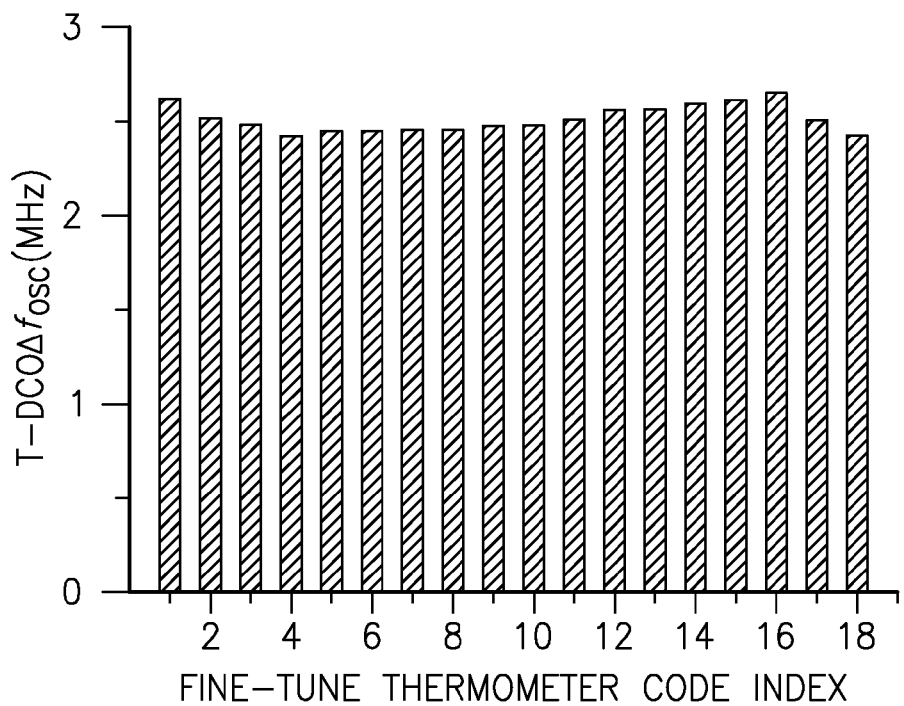
FIG. 13B is a graph illustrating the T-DCO fine tuning characteristic.

The measured T-DCO coarse-tuning characteristics are also plotted in FIG. 11 which is comparable to the L-DCO. The T-DCO ranges from 55.7 to 61.56 GHz. The MB curve of the T-DCO is very close to that of the L-DCO and thus it is not repeated here. The measured tuning step in the FB for each thermometer code is plotted in FIG. 13B. The FB has a mean DCO tuning step of ~2.5 MHz with less than 5% systematic mismatch which could be digitally calibrated and compensated upon modulation (i.e. predistortion), if necessary. The mismatch can be further improved by adding dummy shield strips at the edges of the structure. One extra bit in the FB is reserved for the ΣΔ dithering in the ADPLL. A first-order ΣΔ with 5 fractional bits yields a frequency resolution of 78 kHz in the 60-GHz band.

A commonly used oscillator figure-of-merit $FoM_T$ is defined in (7) below, where PN is defined as the phase noise at 1 MHz offset of the carrier at frequency $f_0$, FTR is the tuning range in percent and $P_{DC}$ is the power dissipation of the oscillator. This $FoM_T$ includes the frequency tuning range but fails to account for the frequency resolution ($\Delta f_{res}$) that is crucial for DCOs. Therefore, an alternative DCO figure-of-merit $FoM_{DT}$ is presented in (8) below where $N_{eff}$ is the effective number of tuning bits in the DCO as calculated by $\log_2 (f_0 \cdot FTR/100/\Delta f_{res})$. The L- and T-DCOs stand out with wide-tuning range and fine-frequency resolution for comparable PN performance and achieve a higher FoM$_{DT}$ compared to the other two DCOs operating at 60- and 50-GHz band, respectively.

Values for FoM$_T$ are −177.9 for both the L-DCO and T-DCO. Values for FoM$_{DT}$ are −181.3 for the L-DCO and −179.3 for the T-DCO.

The digitally-reconfigurable passive resonator with distributed metal capacitors in a mm-wave DCO achieves wide tuning range and small tuning steps simultaneously. Metal-oxide-metal capacitors are employed for all of the tuning banks, thus avoiding the use of low-Q MOS varactors. Two fine-tuning techniques to obtain sub-MHz frequency resolution at mm-wave are described in detail supra and have been incorporated in 60-GHz DCO circuits implemented in 90-nm CMOS. The distributed LC fine-tuning scheme in the L-DCO loads the inductor along its length capacitively thereby modifying the tuning sensitivity of the LC tank. It realizes a frequency resolution better than 160 kHz at 60 GHz. The transformer-coupled fine-tuning scheme implemented in the T-DCO attenuates the effect of a change in capacitance via weak magnetic coupling so that practical capacitor values may be employed. The measured T-DCO fine-tuning step is 2.5 MHz. The T-DCO is not limited in its tuning arrangement by the physical size of the inductor (a limitation of the L-DCO) and a large number of fine-tuning bits can be implemented. Moreover, a simple binary-to-thermometer decoder is sufficient for tuning word generation in an ADPLL since all three tuning banks in T-DCO are linear.

Both 60-GHz DCOs achieve ~6 GHz tuning range with more than 12-bit resolution and phase noise is better than −90.5 dBc/Hz at 1 MHz offset which surpasses the performance of the previously reported designs. The passive resonator consisting of distributed switchable metal capacitors makes a wideband high-resolution DCO feasible at mm-wave frequencies. An all-digital PLL incorporating these high-performance DCOs enable more mm-wave applications at a reduced implementation cost.

Figure 15:
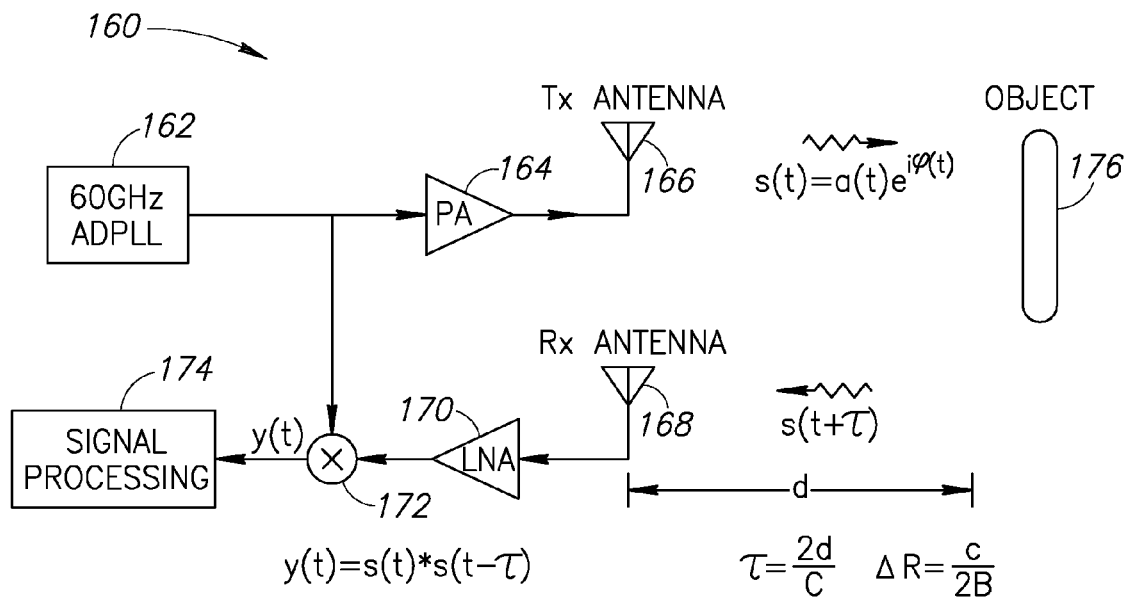
FIG. 15 is a diagram illustrating an example FMCW radar system incorporating the DCO of the present invention.

The L-DCO and T-DCO of the present invention may be incorporated into an FMCW radar system. A diagram illustrating an example FMCW radar system incorporating the DCO of the present invention shown in FIG. 15. The system, generally referenced 160, comprises a 60 GHz ADPLL 162 incorporating the L-DCO or T-DCO of the present invention, power amplifier 164, transmit antenna 166, receive antenna 168, low noise amplifier (LNA) 170, mixer 172 and receive signal processing block 174.

Figure 16:
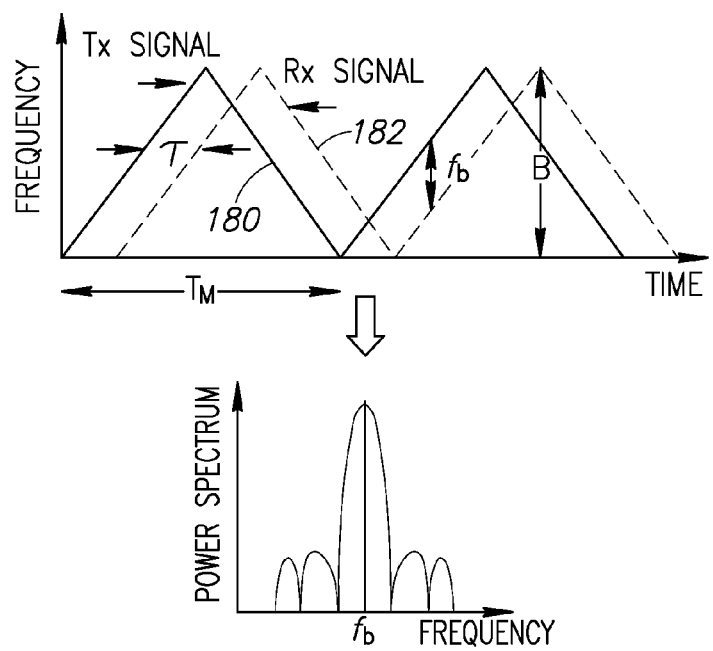
FIG. 16 is a diagram illustrating transmitted and received signals in the FMCW radar system of FIG. 15.

In such an FMCW radar system, the achievable range and velocity resolutions depend on the transmitter bandwidth (BW) and the period (T$_{mod}$) of the linear frequency sweep, referred to as the linear chirp as shown in FIG. 16 where trace 180 represents the TX signal and trace RX represents the RX signal after reflection off the object 176. For short-range detection, a modulation BW up to several gigahertz is required to obtain range resolution Δr $$(\Delta r = \frac{c}{2 \cdot BW},$$

c is speed of light) better than 10 cm. A fast chirp is desired to keep the received baseband beat frequency far enough from the flicker noise region. By contrast, a slow chirp (e.g., T$_{mod}$ of 10 ms) is required for high resolution velocity detection $$(\Delta v = \frac{c}{2} \frac{1}{T_{mod} \cdot f_C},$$

f$_c$ is the center operating frequency) in a long-range scenario such as 77/79 GHz automotive radar. Nonlinearities in the frequency ramp result in an error in the range measurement as the transmit signal is used to detect the signal received from the target. Therefore, the frequency synthesizer for an FMCW radar must provide a carrier with high purity and moreover should generate wideband ultra-linear modulation of the output frequency with a programmable modulation BW and period.

The 60-GHz ADPLL described in detail supra enables an all-digital synthesizer architecture for mm-wave FMCW radar applications and utilizes digital signal processing to improve chirp linearity. In order to synthesize a linear chirp of several gigahertz in range, multiple DCO tuning banks of various tuning step sizes (i.e. different K$_{DCO}$) are employed. A closed-loop DCO gain linearization algorithm can be used to compensate for the process, voltage and temperature (PVT) variations of K$_{DCO}$, with the calibration data stored in an SRAM look-up table. Upon modulation a predistorted signal is applied in the data path of the DCO to obtain higher sweep linearity across a gigahertz modulation range.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

The corresponding structures, materials, acts and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application and to enable others of ordinary skill in the art to understand the invention for various embodiments with various modifications as are suited to the particular use contemplated.

What is claimed is:

1. An oscillator circuit, comprising:
   an active network operative to sustain an oscillation;
   a passive network coupled to said active network;
   wherein said passive network comprises a tank circuit incorporating an inductor, said inductor loaded differentially by a plurality of pairs of parallel, reconfigurable switched metal strip capacitors controlled in accordance with a digital tuning control code; and wherein the influence of each said metal strip capacitor pair in said tank circuit varies with its position along said inductor.

2. The oscillator circuit according to claim 1, wherein said tuning control code is operative to switch one or more of said metal strip capacitors into and out of said tank circuit thereby changing the oscillation frequency of said oscillator.

3. The oscillator circuit according to claim 1, further comprising a coarse tuning circuit coupled to said active network and comprising a plurality of digitally controlled metal tuning capacitors which can be switched into and out of coarse tuning circuit in accordance with a tuning control code thereby changing the oscillation frequency of said oscillator.

4. The oscillator circuit according to claim 1, wherein placing a metal strip capacitor close to a center tap on one end of said inductor introduces less phase shift compared to directly loading said inductor at differential terminals on an opposite end of said inductor coupled to said active network.

5. The oscillator circuit according to claim 1, wherein when a switch in series with a metal strip capacitor is on, said inductor sees an increased capacitive load thereby increasing the differential impedance of said tank circuit.

6. The oscillator circuit according to claim 1, wherein said inductor exhibits nonlinear tuning sensitivity along a length of said inductor.

7. The oscillator circuit according to claim 1, wherein said inductor further comprises a center tap coupled to a voltage source.

8. The oscillator circuit according to claim 1, wherein said tank circuit including said inductor forms a fine tuning bank having a tuning sensitivity that reduces gradually along a length of said inductor.

9. The oscillator circuit according to claim 1, further comprising a predistortion module operative to compensate for mismatch and nonlinearities of said plurality of metal strip capacitors.

10. The oscillator circuit according to claim 1, wherein said pairs of metal strip capacitors are distributed along a major dimension of said inductor.

11. An oscillator circuit, comprising:
an active network;
a digitally controlled passive resonator coupled to said active network;
wherein said passive resonator comprises a tank circuit incorporating a transmission line loaded differentially by a plurality of pairs of parallel, reconfigurable switched metal strip capacitors controlled in accordance with a tuning control code; and
a predistortion module operative to compensate for mismatch and nonlinearities of said plurality of metal strip capacitors.

12. The oscillator circuit according to claim 11, wherein said passive resonator forms a fine tuning bank having a tuning sensitivity that reduces gradually along the major dimension thereof.

13. The oscillator circuit according to claim 11, wherein said switched metal strips are shared by the capacitance and inductance portions of said passive resonator.

14. The oscillator circuit according to claim 11, wherein when a switch in series with a metal strip capacitor is on, said transmission line sees an increased capacitive load thereby increasing the differential impedance of said transmission line.

15. The oscillator circuit of claim 11, wherein tuning of said transmission line is achieved by placing said metal strip capacitors on two or more different metal layers.

16. The oscillator circuit of claim 11, wherein said plurality of distributed metal capacitors are operative to be switched in and out of passive resonator in accordance with a digital tuning control code thereby tuning the oscillation frequency of said oscillator.

17. A digitally controlled oscillator (DCO), comprising:
an active network;
a digitally controlled passive resonator coupled to said active network, said passive resonator comprising a transformer having a primary winding coupled to said active network and a secondary winding loaded differentially by a plurality of pairs of parallel, reconfigurable switched metal strip capacitors controlled in accordance with a digital tuning control code; and
wherein a change in admittance across said secondary winding is reflected back to said primary winding due to a transformer coupling factor thereby altering the oscillation frequency of said digitally controlled oscillator.

18. The digitally controlled oscillator circuit according to claim 17, further comprising a predistortion module operative to compensate for mismatch and nonlinearities of said plurality of metal strip capacitors.

19. The digitally controlled oscillator circuit according to claim 17, further comprising a digitally controlled capacitor coupled to said active network having a plurality of switched metal strips operative to vary the capacitance of said capacitor thereby providing coarse frequency tuning of said DCO.

20. The digitally controlled oscillator circuit according to claim 17, wherein said plurality of switched metal strips includes one or more parallel metal strips for handling modulation and loop drift tracking functions.

21. The digitally controlled oscillator circuit according to claim 20, wherein metal strips for handling modulation function strips are located between first and second loop drift tracking metal strips.

22. The digitally controlled oscillator circuit according to claim 21, wherein a mid-code is applied to said metal strips and said first and second loop drift tracking metal strips such that the modulation metal strips have the same code as neighboring first and second loop drift tracking metal strips.

23. The digitally controlled oscillator circuit according to claim 21, wherein the order in which loop drift tracking metal strips are switched is adapted to minimize the disturbance to said metal strips.

* * * * *